United States Patent
Krasner

(10) Patent No.: US 6,208,290 B1
(45) Date of Patent: Mar. 27, 2001

(54) GPS RECEIVER UTILIZING A COMMUNICATION LINK

(75) Inventor: Norman F. Krasner, San Carlos, CA (US)

(73) Assignee: SnapTrack, Inc., San Jose, CA (US)

( * ) Notice: Subject to any disclaimer, the term of this patent is extended or adjusted under 35 U.S.C. 154(b) by 0 days.

(21) Appl. No.: 08/842,559

(22) Filed: Apr. 15, 1997

Related U.S. Application Data

(63) Continuation-in-part of application No. 08/759,523, filed on Dec. 4, 1996, now Pat. No. 5,841,396, and a continuation-in-part of application No. 08/612,582, filed on Mar. 8, 1996, now Pat. No. 5,874,914.

(51) Int. Cl.[7] .............................. H04B 7/185; G01S 5/02
(52) U.S. Cl. ............................ 342/357.05; 342/357.09; 342/357.1; 701/213
(58) Field of Search ................... 342/357.05, 357.09, 342/357.1, 457; 701/213

(56) References Cited

U.S. PATENT DOCUMENTS

| 4,445,118 | 4/1984 | Taylor et al. | 343/357 |
|---|---|---|---|
| 4,457,006 | 6/1984 | Maine | 375/87 |

(List continued on next page.)

FOREIGN PATENT DOCUMENTS

| 4424412 | 12/1994 | (DE) . |
|---|---|---|
| 0444738 | 4/1991 | (EP) . |
| 449798A2 | 9/1991 | (EP) . |
| 0512789 A2 | 11/1992 | (EP) . |
| 545636A1 | 6/1993 | (EP) . |
| 0604404 A2 | 6/1994 | (EP) . |
| 2264837 | 9/1993 | (GB) . |
| 2273218 | 6/1994 | (GB) . |
| 2308033 | 11/1997 | (GB) . |
| WO9714049 | 4/1994 | (WO) . |
| WO9428434 | 12/1994 | (WO) . |
| WO9615636 | 5/1996 | (WO) . |

OTHER PUBLICATIONS

PCT International Search Report sent Jul. 11, 1997.
"RTCM Recommended Standards for Differential Navstar GPS Service" Ver. 2.0 Radio Technical Commission for Maritime Services, Jan. 1, 1990.
"Animal–borne GPS: Tracking the Habitat" Rogers & Anson, GPS World, pp. 21, 22, Jul. 1994.
"Navstar GPS User Equipment, Introduction", NATO Feb. 1991.
"Naviatation Journal of the Institute of Navigation" vol. 25, No. 2. The Institute of Navigation, 1978 (entire edition).

(List continued on next page.)

Primary Examiner—Theodore M. Blum
(74) Attorney, Agent, or Firm—Blakely, Sokoloff, Taylor & Zafman

(57) ABSTRACT

Methods and apparatuses for deriving an approximate Doppler for a satellite positioning system (SPS) receiver from an approximate location which is obtained from a cellular communication system information source. In one embodiment, an approximate location of the SPS receiver is derived from the information source and this approximation location is used to determine approximate Dopplers to a plurality of SPS satellites at a given time. The approximate Dopplers are then used to reduce processing time in either determining pseudoranges to the SPS satellites or acquiring signals from the SPS satellites. In another aspect of the invention, a reference signal is used to provide a local oscillator signal which is used to acquire SPS signals in an SPS receiver. This reference signal is extracted from a data signal modulated on a carrier frequency. The data signal on the carrier frequency is transmitted from, in one example, a wireless cell site which is communicating with the SPS receiver which has a cellular based communication receiver.

71 Claims, 15 Drawing Sheets

U.S. PATENT DOCUMENTS

| | | | |
|---|---|---|---|
| 4,601,005 | 7/1986 | Kilvington | 364/602 |
| 4,701,934 | 10/1987 | Jasper | 375/1 |
| 4,785,463 | 11/1988 | Jane et al. | 375/1 |
| 4,797,677 | 1/1989 | MacDoran et al. | 342/352 |
| 4,959,656 | 9/1990 | Kumar | 342/418 |
| 4,998,111 | 3/1991 | Ma et al. | 342/352 |
| 5,043,736 | 8/1991 | Darnell et al. | 342/357 |
| 5,119,102 | 6/1992 | Barnard | 342/357 |
| 5,153,598 | 10/1992 | Alves, Jr. | 342/352 |
| 5,202,829 | 4/1993 | Geier | 364/449 |
| 5,223,844 | 6/1993 | Mansell et al. | 342/357 |
| 5,225,842 | 7/1993 | Brown et al. | 342/357 |
| 5,245,634 | 9/1993 | Averbuch | 375/108 |
| 5,271,034 | 12/1993 | Abaunza | 375/1 |
| 5,311,194 | 5/1994 | Brown | 342/357 |
| 5,317,323 | 5/1994 | Kennedy et al. | 342/457 |
| 5,323,163 | 6/1994 | Maki | 342/357 |
| 5,323,322 | 6/1994 | Mueller et al. | 364/449 |
| 5,365,447 | 11/1994 | Dennis | 364/449 |
| 5,365,450 | 1/1994 | Schuchman et al. | 364/449 |
| 5,379,047 | 1/1995 | Yokev et al. | 342/457 |
| 5,379,224 | 1/1995 | Brown et al. | 364/449 |
| 5,379,320 | 1/1995 | Fernandes et al. | 375/1 |
| 5,412,388 | 5/1995 | Attwood | 342/357 |
| 5,416,797 | 5/1995 | Gilhousen et al. | 375/705 |
| 5,420,592 | 5/1995 | Johnson | 342/357 |
| 5,420,883 | 5/1995 | Swensen et al. | 375/200 |
| 5,430,759 | 7/1995 | Yokev et al. | 375/202 |
| 5,448,773 | 9/1995 | McBurney et al. | 455/343 |
| 5,483,549 | 1/1996 | Weinberg et al. | 375/200 |
| 5,491,486 | 2/1996 | Welles, II et al. | 342/357 |
| 5,515,062 | 5/1996 | Maine et al. | 342/457 |
| 5,519,760 | 5/1996 | Borkowski et al. | 379/59 |
| 5,913,170 * | 6/1999 | Wortham . | |

OTHER PUBLICATIONS

"GPS Receiver Structures for the Urban Canyon" Petterson et al., ION–GPS–95, Session C4, Land Vehicular Applications, Palm Springs, CA Sep. 1995.

Raab et al., "An Application of the Global Positioning System to Search and Rescue and Remote Tracking", Navigation "Journal of Institute of Navigation" vol. 24, No. 3, 1977.

Davenport, Robert G. "FFT Processing of Direct Sequence Spreading Codes . . . " IEEE 1991. *National Aerospace and Electronics Conference NAECON 1991*, vol. 1 pp. 98–105, May 1991.

PCT International Search Report sent on Mar. 10, 1997.

PCT International Search Report sent on Feb. 21, 1997.

PCT International Search Report sent on May 13, 1997.

U.S. Patent Application Serial No. 08/759,523, filed Dec. 4, 1996 and entitled "An Improved GPS Receiver Utilitzing a Communication Link", 47 pages and 14 sheets of drawings.

* cited by examiner

Cellular Based Information Source

| Service Area | Cell Site # | Service Area # or Location | Cell Site Location | Approximate Doppler |
|---|---|---|---|---|
| A | — | Lat./Long. A | — | Doppler Set A1 ($t_1$)<br>Doppler Set A2 ($t_2$) |
| B | 1 | Lat./Long. B | Lat./Long. B1 | Doppler Set B11 ($t_1$)<br>Doppler Set B12 ($t_2$) |
| B | 2 | Lat./Long. B | Lat./Long. B2 | Doppler Set B21 ($t_1$)<br>Doppler Set B22 ($t_2$) |

GPS RECEIVER UTILIZING A COMMUNICATION LINK

RELATED APPLICATIONS

This application is a continuation-in-part of U.S. patent application Ser. No. 08/759,523, filed on Dec. 4, 1996, now U.S. Pat. No. 5,841,396 by Norman F. Krasner and a continuation-in-part of U.S. patent application Ser. No. 08/612,582, filed on Mar. 8, 1996, now U.S. Pat. No. 5,874,914 by Norman F. Krasner.

This application is also related to and hereby claims the benefit of the filing date of a provisional patent application by the same inventor, Norman F. Krasner, which application is entitled Low Power, Sensitive Pseudorange Measurement Apparatus and Method for Global Positioning Satellites Systems, Ser. No. 60/005,318, filed Oct. 9, 1995.

BACKGROUND OF THE INVENTION

1. Field of the Invention

The present invention relates to receivers capable of determining position information of satellites and, in particular, relates to such receivers which find application in satellite positioning systems (SPS) such as the U.S. global positioning satellite (GPS) systems.

2. Background Art

GPS receivers normally determine their position by computing relative times of arrival of signals transmitted simultaneously from a multiplicity of GPS (or NAVSTAR) satellites. These satellites transmit, as part of their message, both satellite positioning data as well as data on clock timing, so-called "ephemeris" data. The process of searching for and acquiring GPS signals, reading the ephemeris data for a multiplicity of satellites and computing the location of the receiver from this data is time consuming, often requiring several minutes. In many cases, this lengthy processing time is unacceptable and, furthermore, greatly limits battery life in micro-miniaturized portable applications.

Another limitation of current GPS receivers is that their operation is limited to situations in which multiple satellites are clearly in view, without obstructions, and where a good quality antenna is properly positioned to receive such signals. As such, they normally are unusable in portable, body mounted applications; in areas where there is significant foliage or building blockage; and in in-building applications.

There are two principal functions of GPS receiving systems: (1) computation of the pseudoranges to the various GPS satellites, and (2) computation of the position of the receiving platform using these pseudoranges and satellite timing and ephemeris data. The pseudoranges are simply the time delays measured between the received signal from each satellite and a local clock. The satellite ephemeris and timing data is extracted from the GPS signal once it is acquired and tracked. As stated above, collecting this information normally takes a relatively long time (30 seconds to several minutes) and must be accomplished with a good received signal level in order to achieve low error rates.

Virtually all known GPS receivers utilize correlation methods to compute pseudoranges. These correlation methods are performed in real time, often with hardware correlators. GPS signals contain high rate repetitive signals called pseudorandom (PN) sequences. The codes available for civilian applications are called C/A codes, and have a binary phase-reversal rate, or "chipping" rate, of 1.023 MHz and a repetition period of 1023 chips for a code period of 1 msec. The code sequences belong to a family known as Gold codes. Each GPS satellite broadcasts a signal with a unique Gold code.

For a signal received from a given GPS satellite, following a downconversion process to baseband, a correlation receiver multiplies the received signal by a stored replica of the appropriate Gold code contained within its local memory, and then integrates, or lowpass filters, the product in order to obtain an indication of the presence of the signal. This process is termed a "correlation" operation. By sequentially adjusting the relative timing of this stored replica relative to the received signal, and observing the correlation output, the receiver can determine the time delay between the received signal and a local clock. The initial determination of the presence of such an output is termed "acquisition." Once acquisition occurs, the process enters the "tracking" phase in which the timing of the local reference is adjusted in small amounts in order to maintain a high correlation output. The correlation output during the tracking phase may be viewed as the GPS signal with the pseudorandom code removed, or, in common terminology, "despread." This signal is narrow band, with bandwidth commensurate with a 50 bit per second binary phase shift keyed data signal which is superimposed on the GPS waveform.

The correlation acquisition process is very time consuming, especially if received signals are weak. To improve acquisition time, many GPS receivers utilize a multiplicity of correlators (up to 12 typically) which allows a parallel search for correlation peaks.

Another approach to improve acquisition time is described in U.S. Pat. No. 4,445,118, referred to as the "Taylor patent." This approach uses the transmission of Doppler information from a control basestation to a remote GPS receiver unit in order to aid in GPS signal acquisition. While this approach does improve acquisition time, the Doppler information is transmitted from a basestation to a mobile GPS receiver by a point to point transmission system, and there is no indication of how this Doppler information is obtained.

An approach for improving the accuracy of the position determination by a remote GPS receiver unit is also described in the Taylor patent. In the Taylor patent, a stable frequency reference is transmitted to a remote GPS receiver unit from a basestation in order to eliminate a source of error due to a poor quality local oscillator at the remote GPS receiver unit. This method uses a special frequency shift keyed (FSK) signal that must be situated in frequency very close to the GPS signal frequency. As shown in FIG. 4 of the Taylor patent, the special FSK signal is about 20 MHz below the 1575 MHz GPS signal which is also received by the receiver in order to demodulate the GPS satellite signals from the GPS satellites so as to extract satellite position data. Moreover, the approach described in the Taylor patent uses a common mode rejection mechanism in which any error in the local oscillator (shown as L.O. 52) of the receiver will appear in both the GPS channel and the reference channel and hence be canceled out. There is no attempt to detect or measure this error. This approach is sometimes referred to as a homodyne operation. While this approach provides some advantages, it requires that the two channels be closely matched, including closely matched in frequency. Moreover, this approach requires that both frequencies remain fixed, so frequency hopping or frequency tuning (channelization) techniques are not compatible with this approach.

SUMMARY OF THE INVENTION

In one aspect of the present invention, a method is described for reducing processing time due to Doppler error in a satellite positioning system (SPS) receiver having a cell based communication receiver. The method includes determining an approximate location of the SPS receiver from a cell based information source. This approximate location is determined by using at least one of a location of a cellular service area which includes a cell site which is capable of communicating with the cell based communication receiver or a location of the cell site itself. The method further includes determining an approximate Doppler for at least one SPS satellite relative to the SPS receiver, where the approximate Doppler is based upon the approximate location. This approximate Doppler is used in the SPS receiver to reduce processing time in either determining at least one pseudorange to the at least one SPS satellite, or in acquiring signals from the at least one SPS satellite.

An exemplary embodiment of this method is a cellular telephone which includes a GPS receiver. The cellular telephone operates by communicating with cell sites, each of which are connected to a cellular switching center. A database, which represents a cellular based information source, may be maintained at the cellular switching center or at the cell site or at a remote processing station, which may be termed a "server," may be used to determine an approximate location of the cellular telephone based upon the cell site (or cellular service area) with which the cellular telephone is communicating. This approximate location may then be used to derive an approximate Doppler relative to the various SPS satellites which are transmitting SPS signals to the GPS receiver in the cellular telephone. This approximate Doppler is then transmitted in one embodiment from the cell site to the cellular telephone, and is then used in the GPS receiver in order to reduce processing time due to Doppler induced effects in the GPS receiver.

A further embodiment of this aspect of the present invention is a data processing station which includes a processor and a storage device coupled to the processor, and a transceiver coupled to the processor. The transceiver is for coupling the data processing station to a wireless cell site. The storage device contains information specifying at least one approximate Doppler at a given time for an approximate location which is determined by at least one of a location of a cellular service area which includes the wireless cell site or a location of the wireless cell site itself. The transceiver receives a site information which determines the approximate location, and the processor determines an approximate Doppler for at least one SPS satellite which is in view of said approximate location. The approximate Doppler is based upon the approximate location. The transceiver sends this approximate Doppler to the wireless cell site which then transmits the approximate Doppler to a cell based communication receiver which is coupled to an SPS receiver.

Another aspect of the present invention relates to a method for providing a local oscillator signal in a mobile satellite positioning system receiver. The method includes receiving a signal having a carrier frequency and a data signal modulated on the carrier frequency, extracting a reference signal from the data signal modulated on the carrier frequency, and using the reference signal to provide a local oscillator signal to acquire SPS signals from SPS satellites.

Another embodiment according to this aspect of the present invention, is a combined SPS receiver and communication system. The communication system includes an acquisition and tracking circuitry which is coupled to an antenna to receive the communication signals. This acquisition and tracking circuitry acquires and tracks the data signal which is modulated onto a carrier frequency and provides a reference signal from the data signal modulated on the carrier frequency. The reference signal is then provided to a phaselock loop or to a frequency synthesizer in order to generate a local oscillator signal which is used to acquire SPS signals in the SPS receiver.

In another aspect of the present invention, a method for determining a position of an SPS receiver having a wireless cell based transmitter is described. This method includes determining an approximate location of the SPS receiver from a cell based information source. The approximate location is determined by at least one of a location of a cellular service area which includes a wireless cell site which is capable of communicating with the cell based transmitter or a location of the wireless cell site. The SPS receiver receives a source of SPS signals and determines a plurality of pseudorange data and transmits this plurality of pseudorange data to the wireless cell site. Then a position of the SPS receiver is computed by using the SPS signals, the plurality of pseudoranges and the approximate location. In this method, the approximate location is used to facilitate convergence of the position calculation.

In another aspect of the present invention, a method for providing Doppler information to an SPS receiver is described. In this method, a plurality of approximate Doppler data from an approximate location is determined. This approximate location is based upon at least one of a location of a wireless cell site or a location of a cellular service area which includes the wireless cell site. The plurality of approximate Doppler data is for a corresponding plurality of satellites. The method further includes broadcasting the plurality of approximate Doppler data from a wireless cell transmitter of the wireless cell site to a plurality of SPS receivers in a cell serviced by the wireless cell site. Typically, at least in one embodiment, the cell site would then receive a plurality of pseudoranges and would forward these pseudoranges to a remote processing station in which the position of the SPS receiver is computed using the SPS signals and the pseudoranges.

In yet another aspect of the present invention, a method for providing satellite information to an SPS receiver is described. This method includes determining an approximate location from a cellular based information source and determining a plurality of satellite ephemeris data for a corresponding plurality of satellites which are in view of the approximate location. The method further includes transmitting the plurality of satellite ephemeris data from a wireless cellular transmitter of the wireless cell site to an SPS receiver in a cell serviced by the wireless cell site.

In yet another aspect of the present invention the approximate location, which is derived from a cell based information source, is used to select a particular set of differential GPS correction data.

Various embodiments of apparatuses which can perform the various methods described above are also described herein.

BRIEF DESCRIPTION OF THE DRAWINGS

The present invention is illustrated by way of example and not limitation in the figures of the accompanying drawings in which like references indicate similar elements.

FIG. 5 shows an exemplary representation of a cellular based information source which provides an association between sets of Doppler information at given times relative to cellular service areas and/or cellular cell sites.

DETAILED DESCRIPTION

The present invention primarily relates to apparatuses and methods for computing the position of a mobile object by using a communication link. In one embodiment, this communication link is used to determine an approximate Doppler to thereby reduce processing time due to Doppler induced error in a satellite positioning system (SPS) receiver. In another embodiment, the communication link is used to provide a data signal from which a reference signal is extracted. This reference signal is used to provide a local oscillator signal in the SPS receiver to acquire SPS signals.

Figure 1:
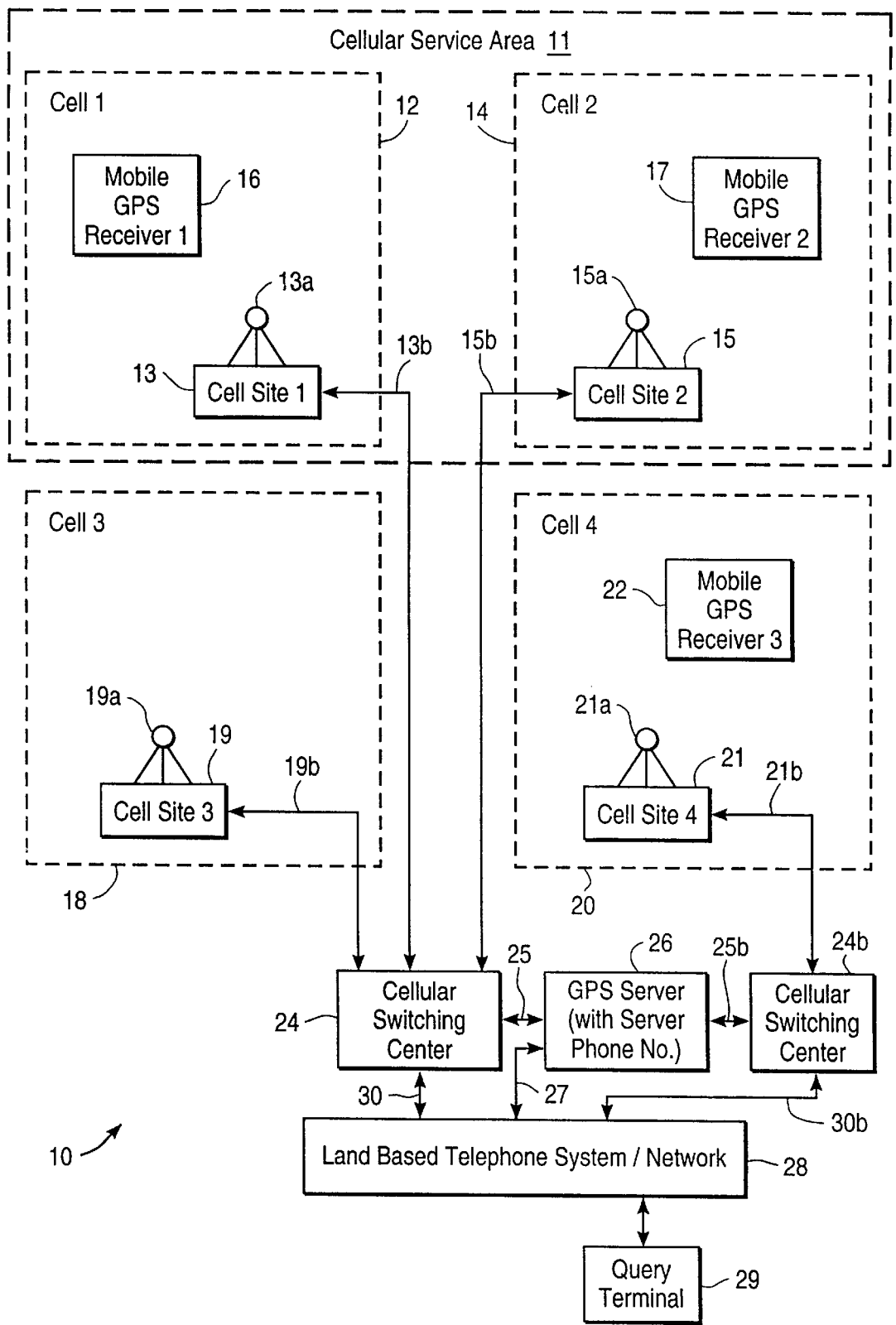
FIG. 1 illustrates a cellular communication system having a plurality of cells each of which is serviced by a cell site, and each of which is coupled to a cellular switching center.

One aspect of the present invention relates to a cellular based communication system which includes a cellular based information source that is used to provide approximate Doppler information in response to the determination of approximate location. FIG. 1 shows an example of a cellular based communication system 10 which includes a plurality of cell sites, each of which is designed to service a particular geographical region or location. Examples of such cellular based communication systems are well known in the art. See, for example, U.S. Pat. No. 5,519,760 which describes a cellular network-based location system. The cellular based communication system 10 includes two cells 12 and 14 both of which are defined to be within a cellular service area 11. In addition, the system 10 includes cells 18 and 20. It will be appreciated that a plurality of other cells with corresponding cell sites and/or cellular service areas may also be included in the system 10 and coupled to one or more cellular switching centers, such as the cellular switching center 24 and cellular switching center 24b.

Figure 7A:
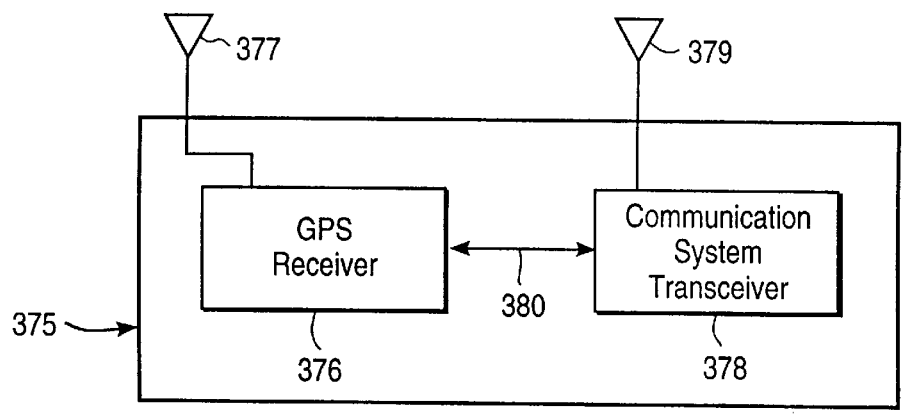
FIG. 7A illustrates an example of a combined SPS receiver and communication system according to one embodiment of the present invention.

Within each cell, such as cell 12, there is a wireless cell or cellular site such as cell site 13 which includes an antenna 13a which is designed to communicate through a wireless communication medium with a communication receiver which may be a combined mobile GPS receiver and communication system such as the receiver 16 shown in FIG. 1. An example of such a combined system is shown in FIG. 7A and may include both a GPS antenna 377 and a communication system antenna 379. It will be appreciated that alternative embodiments may employ a single antenna or more than two antennas.

Each cell site is coupled to a cellular switching center. In FIG. 1, cell sites 13, 15, and 19 are coupled to switching center 24 through connections 13b, 15b and 19b respectively and cell site 21 is coupled to a different switching center 24b through connection 21b. These connections are typically wire line connections between the respective cell site and the cellular switching centers 24 and 24b. Each cell site includes an antenna for communicating with communication systems serviced by the cell site. It will be appreciated that a communication system within one cell, such as the receiver 22 shown in cell 4, may in fact communicate with the cell site 19 in cell 18 due to blockage (or other reasons why cell site 21 cannot communicate with the receiver 22).

In a typical embodiment of the present invention, the mobile GPS receiver 16 includes a cellular based communication system which is integrated with the GPS receiver, such that both the GPS receiver and the communication system are enclosed in the same housing. One example of this is a cellular telephone having an integrated GPS receiver which shares common circuitry with the cellular based telephone transceiver, such as that shown in FIG. 7B. When this combined system is used for cellular telephone communications, transmissions occur between the receiver 16 and the cell site 13. Transmissions from the receiver 16 to the cell site 13 are then propagated over the connection 13b to the cellular switching center 24 and then to either another cellular telephone in a cell serviced by the cellular switching center 24, or through a connection 30 (typically wired) to another telephone through the land based telephone system/network 28. It will be appreciated that the term wired includes fiber-optic and other non-wireless connections such as copper cabling, etc. Transmissions from the other telephone which is communicating with the receiver 16 are conveyed from the cellular switching center 24 through the connection 13b and the cell site 13 back to the receiver 16 in the conventional manner.

The remote data processing system 26 (which may be referred to in some embodiments as a GPS server) is included in the system 10 and is used when, in some embodiments, a mobile GPS receiver within a particular cell is used to determine the position of the receiver using GPS signals received by the GPS receiver. The GPS server 26 may be coupled to the land based telephone system/network 28 through a connection 27 and it may also be optionally coupled to the cellular switching center 24 through the connection 25 and also optionally coupled to center 24b through the connection 25b. It will be appreciated that connections 25 and 27 are typically wired connections although they may be wireless. Also shown as an optional component of the system 10 is a query terminal 29 which may consist of another computer system which is coupled through the network 28 to the GPS server. This query terminal 29 may send a request for the position of a particular GPS receiver in one of the cells to the GPS server 26 which then initiates a conversation with a particular GPS receiver through the cellular switching center in order to determine the position of the GPS receiver and report that position back to the query terminal 29.

It should be noted that a cellular based communication system is a communication system which has more than one transmitter, each of which serves a different geographical area, which is predefined at any instant in time. Typically, each transmitter is a wireless transmitter which serves a cell which has a geographical radius of less than 20 miles, although the area covered depends on the particular cellular system. There are numerous types of cellular communication systems, such as cellular telephones, PCS (personal communication system), SMR (specialized mobile radio), one way and two-way pager systems, RAM, ARDIS, and wireless packet data systems. Typically the predefined different geographical areas are referred to as cells and a plurality of cells are grouped together into a cellular service area such as the cellular service area 11 shown in FIG. 1 and these plurality of cells are coupled to one or more cellular switching centers which provide connections to land based telephone systems and/or networks. Service areas are often used for billing purposes. Hence, it may be the case that cells in more than one service area are connected to one switching center. For example, in FIG. 1, cells 1 and 2 are in service area 11, and cell 3 is in service area 18, but all three are connected to switching center 24. Alternatively it is sometimes the case that cells within one service area are connected to different switching centers, especially in dense population areas. In general, a service area is defined as a collection of cells within close geographical proximity to one another. Another class of cellular systems that fits the above description is satellite based, wherein the cellular basestations are satellites that typically orbit the earth. In these systems, the cell sectors and service areas move as a function of time. Examples of such systems include Iridium, Globalstar, Orbcomm and Odyssey.

Figure 2:
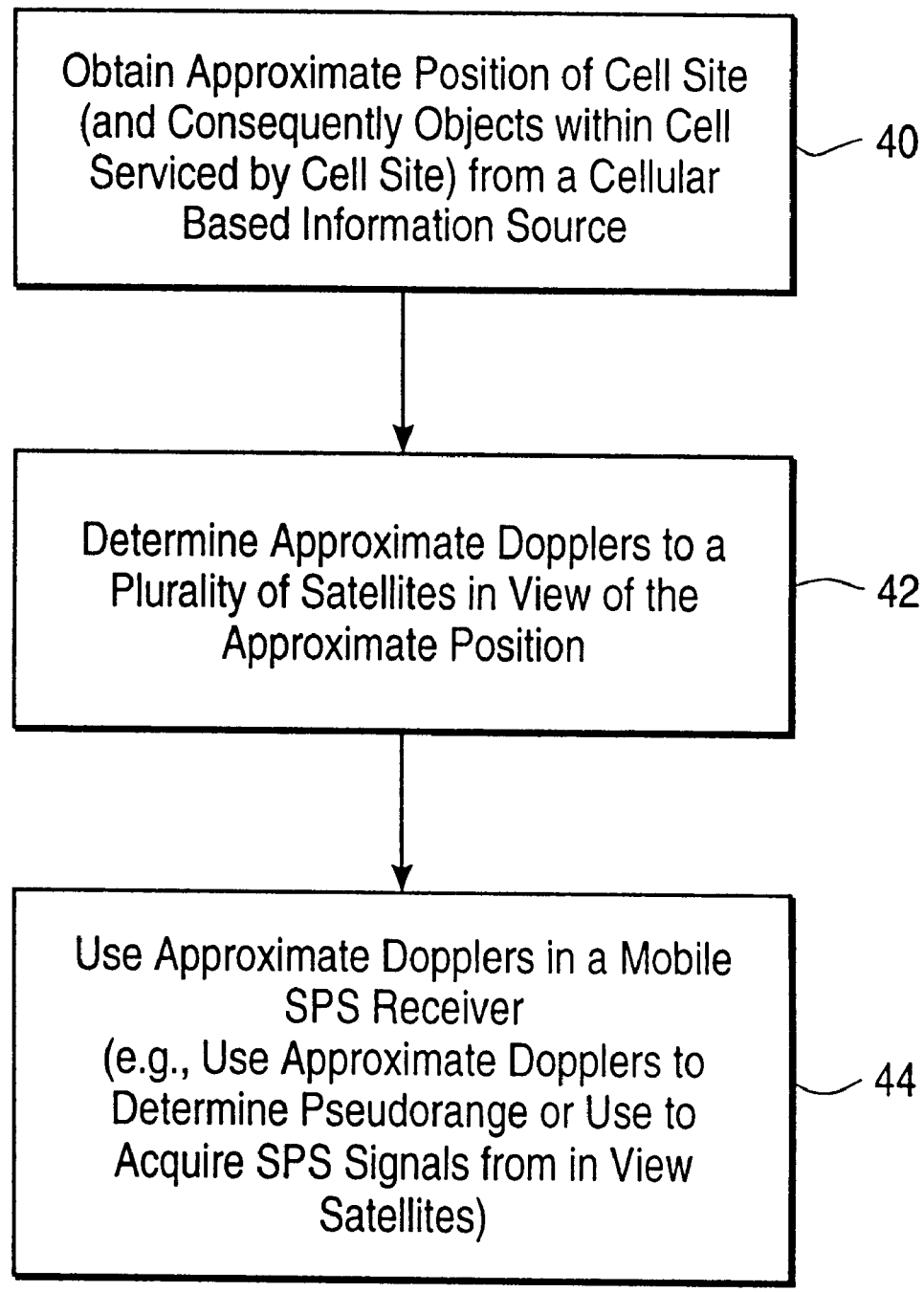
FIG. 2 represents a generalized flowchart according to one embodiment of the present invention.

FIG. 2 shows a generalized example of the present invention in which approximate Doppler information is derived from approximate position information from a cellular based information source. The method begins in step 40 in which an approximate position of the cell site (and consequently objects within the cell serviced by the cell site) is determined from a cellular based information source. Alternatively, the approximate position may represent a position within the cellular service area which includes the cell site. In step 42, approximate Dopplers to a plurality of satellites in view of the approximate position is determined. Then in step 44, the approximate Dopplers are used in a mobile SPS receiver in order to reduce processing time due to Doppler induced effects in determining the position of the SPS receiver. The approximate Dopplers are typically used to determine pseudoranges or may be used to acquire SPS signals from in view satellites. An example of the use of approximate Doppler is described in co-pending U.S. patent application Ser. No. 08/612,669, filed Mar. 8, 1996, now U.S. Pat. No. 5,663,734, which is hereby incorporated herein by reference. The use of Doppler information in a mobile SPS receiver to reduce processing time due to Doppler induced error and to also reduce error in determining the position of the SPS receiver is also described in co-pending U.S. patent application Ser. No. 08/759,523, which was filed Dec. 4, 1996, and which is hereby incorporated herein by reference. It is noted that for most of those embodiments where the mobile SPS receiver transmits a pseudorange to a server (for the position calculation to be completed by the server), the Doppler is transmitted to the SPS receiver (or used in the SPS receiver) and used in the SPS receiver without extracting satellite position information from SPS signals. In other words, in this case the SPS receiver will not receive and demodulate SPS signals (from SPS satellites) for the purpose of extracting satellite position information (such as ephemeris) from the SPS signals from the SPS satellites. It is also noted here that without Doppler information the SPS receiver must search over a wide range of carrier frequencies, which may take a very long time.

Figure 3A:
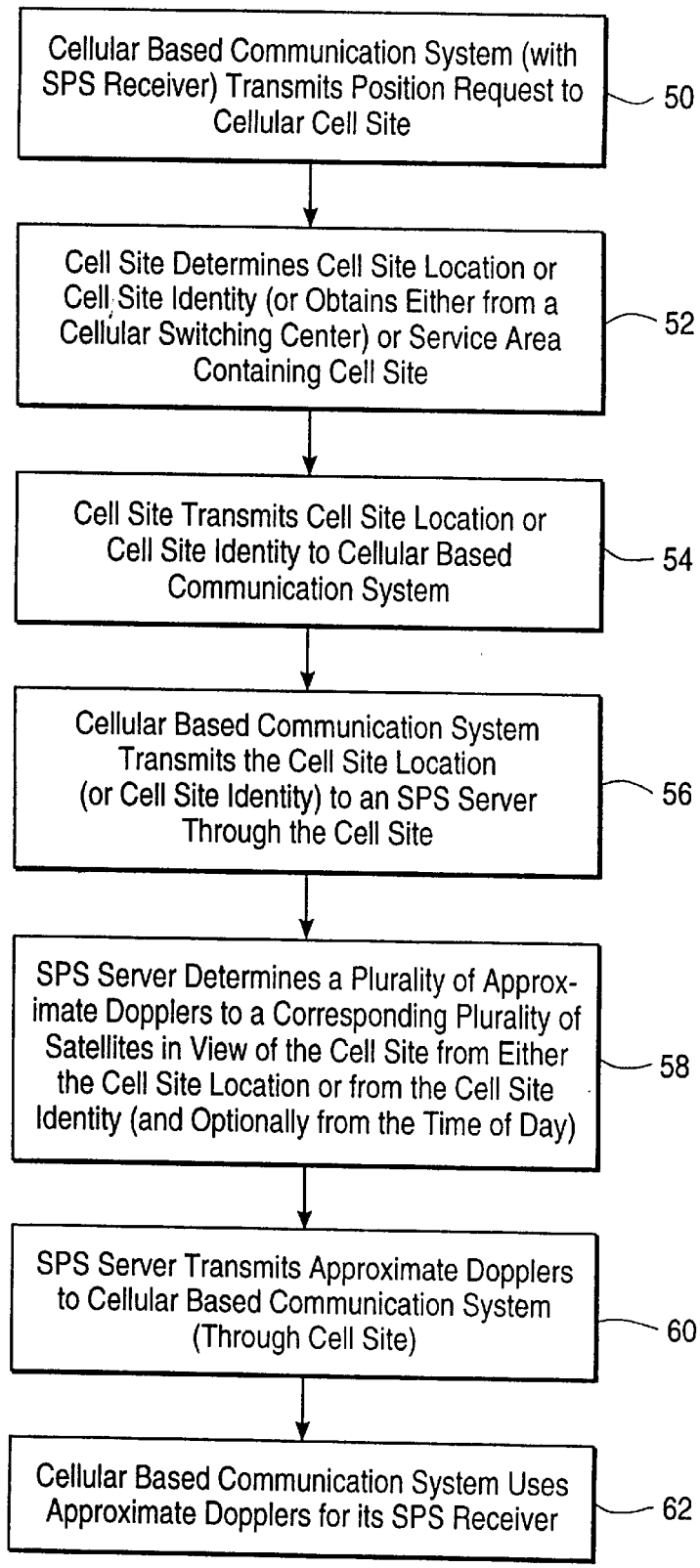
FIG. 3A shows a flowchart illustrating one particular implementation of the present invention in which cellular based information is used to obtain approximate Doppler information.

FIG. 3A illustrates one particular implementation of the present invention in which a cellular based information source is used to obtain a plurality of approximate Doppler information to a corresponding plurality of satellites in view of the approximate location. This particular implementation, in one embodiment, may involve the use of a "911" panic call from a cellular telephone which will then cause the cellular based system to determine the location of the cellular telephone. Thus, the cellular telephone itself initiates the communication with the cell site as indicated in step 50. The cellular based communication system which includes the SPS receiver (in this case a cellular telephone with a GPS receiver) transmits a position request to the cellular cell site. In one embodiment, the cell site determines the cell site location or the cell site identity or obtains either of these from the cellular switching center or determines the cellular service area which contains the cell site. This is shown as step 52 in FIG. 3A.

As an alternative to this step 52, a cellular telephone may determine from the communication signals transmitted from the cellular site the cellular site's location or identity or the cellular service area. This will be possible in those cellular communication systems in which the mobile cellular based communication system can detect a data signal in the cellular transmission which identifies the cell site or the cellular service area which contains the cell site. An example of this type of communication system is the IS-95 North American Standard code division multiple access system (CDMA). In IS-95 the cell site transmission includes the cell site identity as well as its latitude and longitude. Alternatively, the cell site may be identified by the particular spreading sequence transmitted by the cell site (there are 512 possibilities in IS-95). This alternative is described further below with FIG. 3C. In the case where the mobile cellular based communication system determines the cell site identity or service area identity from the communication signal, then step 52 is not necessary.

Returning to FIG. 3A, step 54 is performed by having the cell site transmit the cell site location or cell site identity or the cellular service area identity to the mobile cellular based communication system. In step 56, the mobile cellular based communication system then transmits the cellular site location or identity or cellular service area which contains the cell site to an SPS server, such as the server 26 shown in FIG. 1 through the cell site.

In step 58, the SPS server determines a plurality of approximate Dopplers to a corresponding plurality of satellites in view of the approximate location from either the cell site location or from the cell site identity or from the cellular service area identity. These Dopplers may be determined from satellite position and velocity information supplied by GPS satellites in the Almanac or ephemeris portions of data messages transmitted within the GPS signals, as is well known in the art. The GPS signals may be received by a receiver at the SPS server or by a receiver remote to it. Typically, the SPS server will also determine the time of day in order to time stamp the approximate Doppler at the approximate location. Alternatively, if the approximate Doppler is provided from a source of approximate Dopplers to the SPS server, and this source of information already takes into account the time of day, then the SPS server need not determine the time of day. Then in step 60, the SPS server transmits the approximate Dopplers to the mobile cellular based communication system through the cell site which is communicating with the cellular based communication system. In step 62, the cellular based communication system uses the approximate Dopplers for its SPS receiver in order to reduce processing time in determining the position of the SPS receiver. Typically, at least in some embodiments, the position calculation is performed at the SPS server after the server receives pseudorange data from the GPS receiver through the cell site and cellular switching center.

It is noted that Doppler may include a Doppler value plus rate of change of Doppler vs. time and/or other mathematical fits of Doppler vs. time. Transmitting such fits to the mobile SPS allows the mobile to compute Doppler accurately for much longer periods (e.g. ½ hour) than would otherwise be possible.

It will be appreciated that an alternative implementation of the method shown in FIG. 3A may include the use of a lookup table (or other storage or computation device) in the mobile cellular based communication system to determine the approximate location (from the cell site identity or cellular service area identity) which is then sent to the SPS server in order to receive an approximate Doppler information from the SPS server. As a further alternative to this method, the approximate location determined in the cellular based communication system from a lookup table or other memory or computation device may be used to determine an approximate Doppler which is stored in a memory or derived from satellite almanac information which is periodically received from SPS satellites or sent to it from the SPS server as previously described. This memory would associate the approximate location with the corresponding approximate Dopplers in a manner similar to that shown in FIG. 5.

Figure 3B:
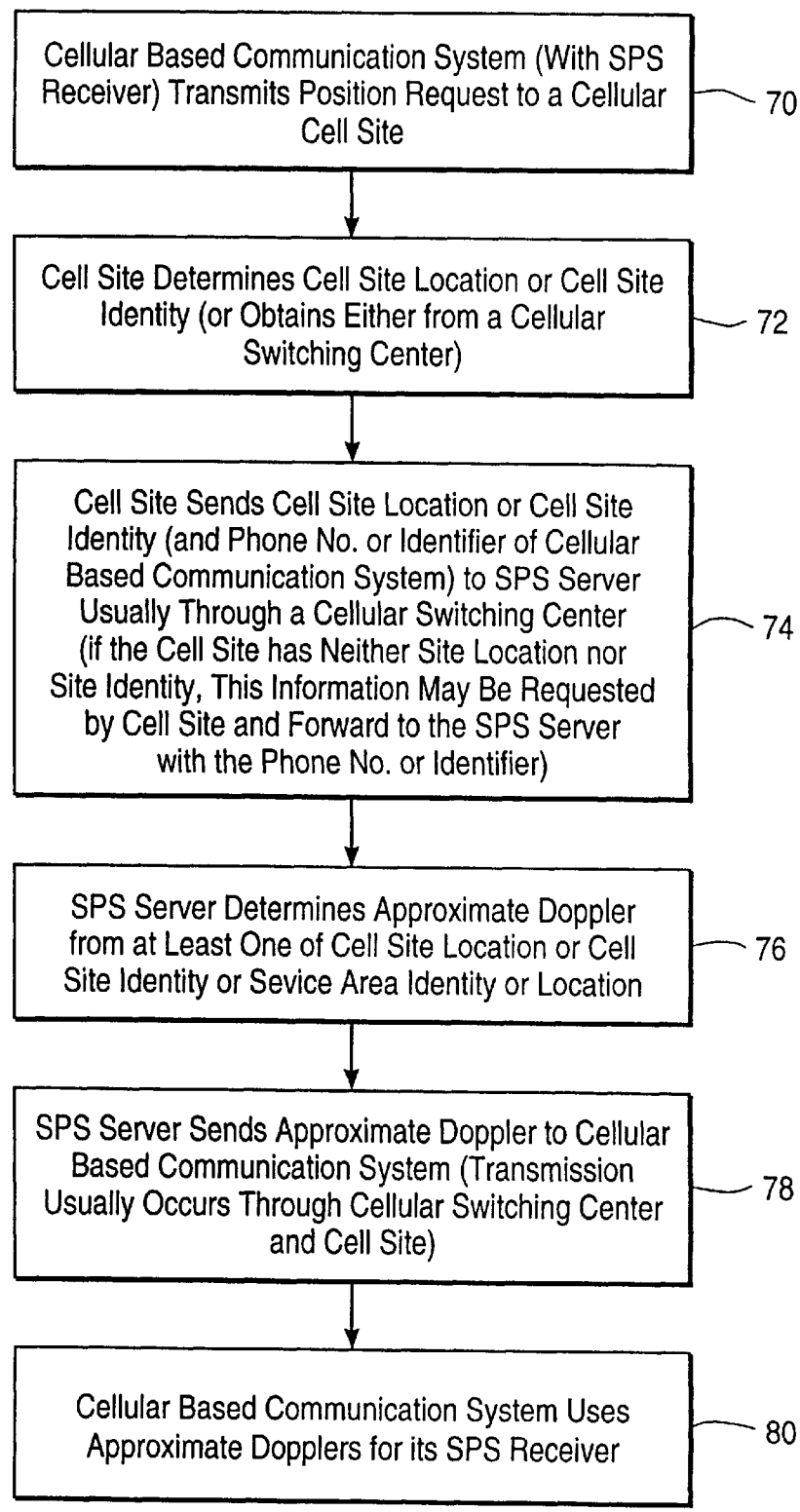
FIG. 3B is a flowchart showing another particular implementation of the present invention in which cellular based information is used to derive approximate Doppler information.

FIG. 3B shows another implementation of the present invention in which a cellular based information source is used to obtain approximate Doppler information which is used in an SPS receiver. This particular implementation of FIG. 3B may also be considered to be a "911" panic circumstance wherein the mobile cellular based communication system, such as a cellular telephone having an integrated SPS receiver, initiates the process by transmitting a position request. Thus, the process of FIG. 3B begins in step 70 in which a cellular based communication system transmits a position request to a cellular cell site. Then in step 72, the cellular cell site determines the cell site location or the cell site identity or the cellular service area identity. Alternatively, this information could be obtained from the cellular switching center if such information is not locally maintained at the cell site. Then at step 74, the cell site sends a cell site location or a cell site identity or a cellular service area identity to an SPS receiver usually through a cellular switching center. The cell site may also send the phone number or identifier of the cellular based communication system in order to allow the SPS server to directly communicate and identify the particular mobile cellular based communication system which initiated the position request in step 70. In step 76, the SPS server determines the approximate Doppler from at least one of the cell site location or cell site identity or service area identity or location. Then in step 78 the SPS server sends the approximate Doppler to the cellular based communication system. This transmission usually occurs through the cellular switching center and the cell site. For example, as shown in FIG. 1, the SPS server 26 may transmit the approximate Doppler information through the cellular switching center 24 and the cell site 13 to the receiver 16, and the switching center 24 may receive this transmission through the land based telephone system/network 28 or may occur through the optional direct connection 25. The cellular based communication system in step 80 then uses the approximate Doppler for its SPS receiver in order to determine pseudoranges to at least one SPS satellite or in order to acquire signals from at least one SPS satellite.

Figure 3C:
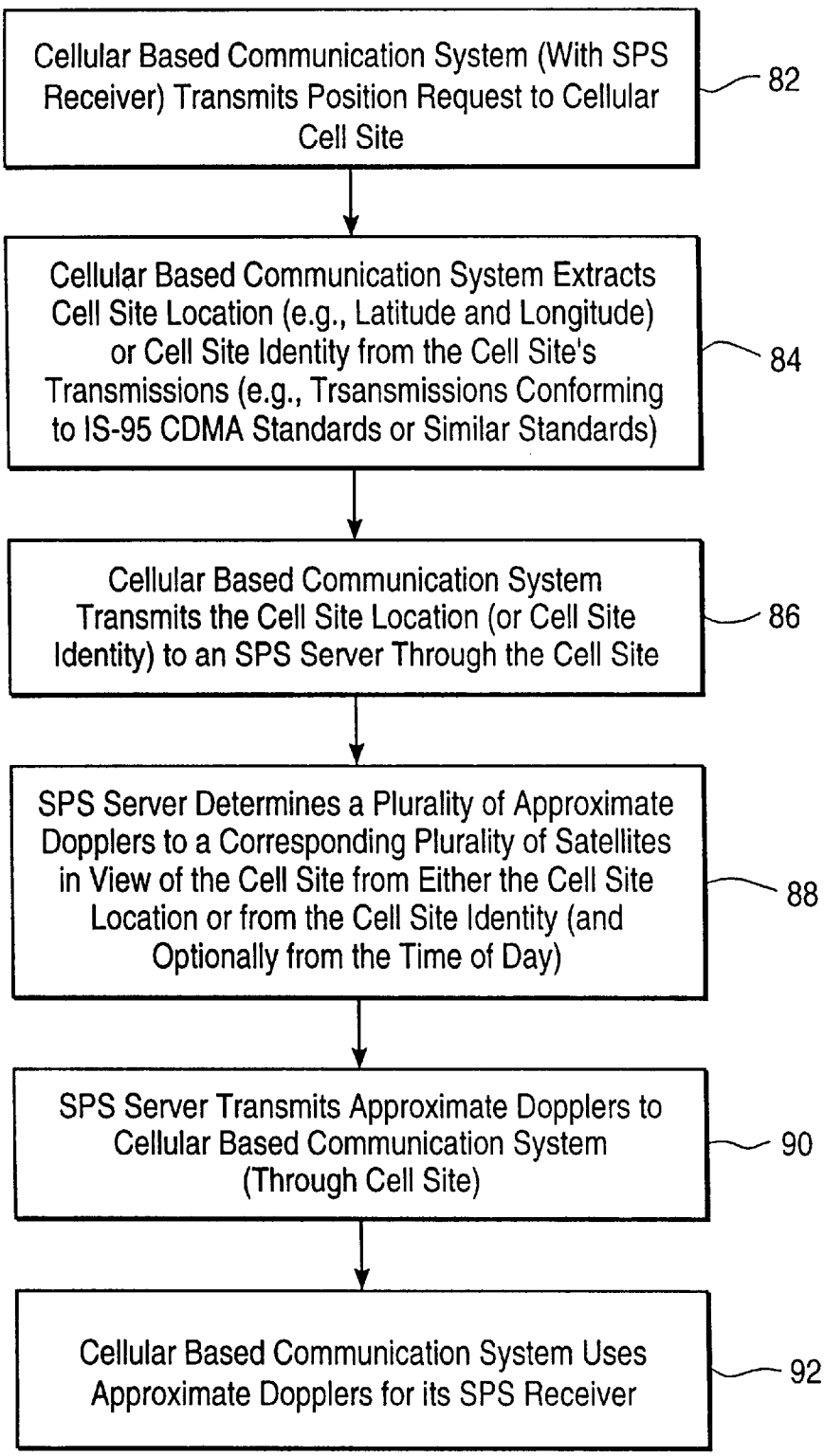
FIG. 3C is a flowchart showing another particular implementation of the present invention wherein the mobile receiver extracts the approximate location from the cellular communication signal.

A further, more specific embodiment of the invention is shown in FIG. 3C. In this example, the mobile cellular based communication system begins a cellular transmission, in step 82, to a cell site. From the ensuing cell site transmissions, in step 84, the cell site location (e.g. latitude and longitude) or cell site identity (or perhaps the cell service area) is determined. In systems conforming to the IS-95 CDMA standard, the latitude and longitude of the cell site is transmitted from the cell site as part of the cellular transmissions from the site. In CDMA, there is also a unique cell site identifier which may be sent to the mobile cellular based communication system. Then, this information is transmitted, in step 86, to the SPS server which determines (in step 88) the approximate Dopplers and transmits these Dopplers (step 90) to the cellular based communication system.

Figure 4A:
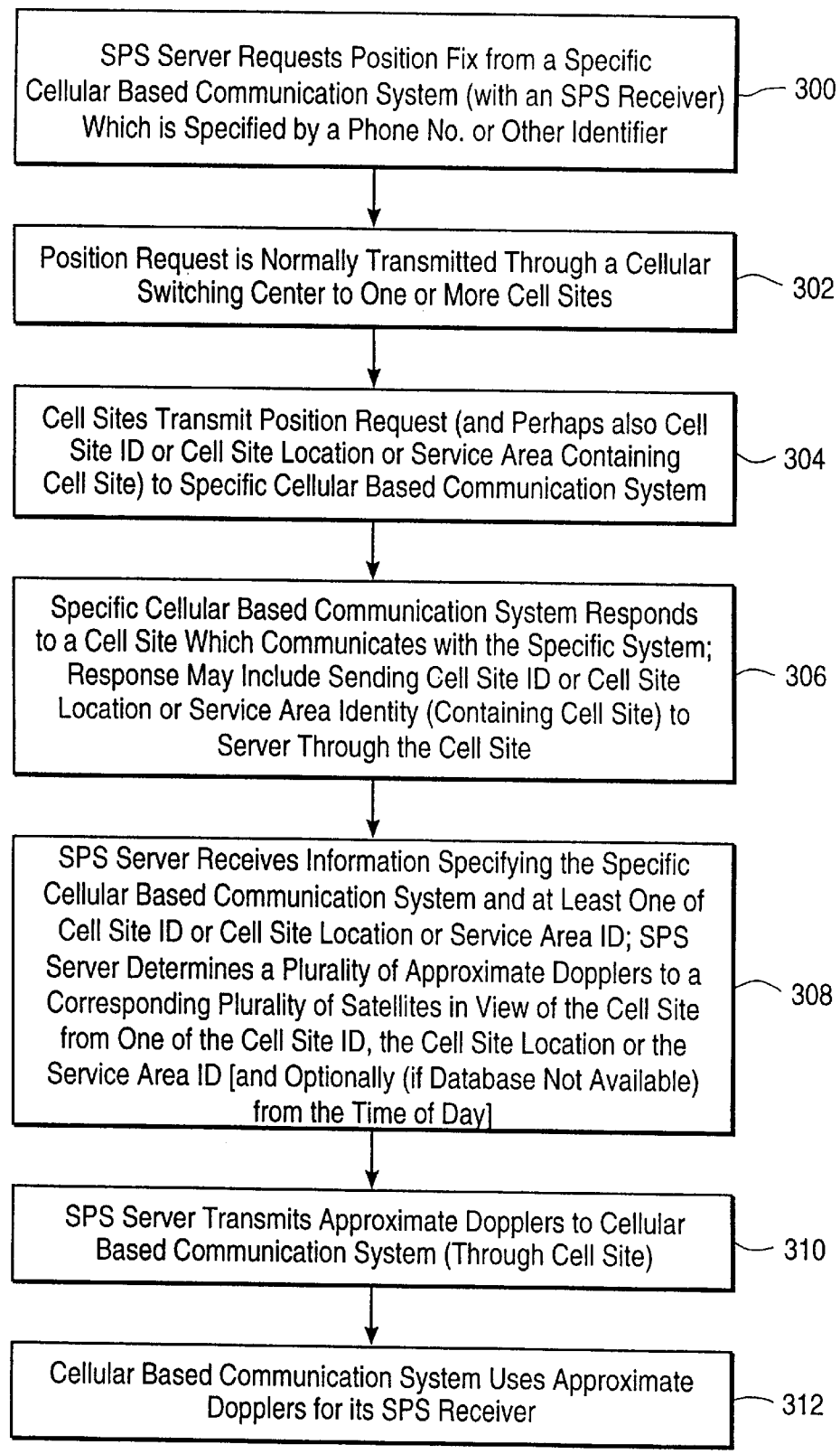
FIG. 4A shows another flowchart of another particular implementation of the present invention in which a cellular based information source is used to derive approximate Doppler information.

FIG. 4A shows another method of the present invention in which a cellular based information source is used to obtain approximate location from which approximate Doppler information for the approximate location is obtained and used by an SPS receiver. The method of FIG. 4A involves one in which the position operation is initiated by the SPS server or by some other system rather than by the mobile cellular based communication system which includes an SPS receiver, such as the receiver 16 shown in FIG. 1. The method of FIG. 4A begins in step 300 in which the SPS server requests a position fix from a specific mobile cellular based communication system which includes an SPS receiver. Typically, the specific cellular based communication system will be specified by a phone number or other identifier. The position request is normally transmitted in step 302 through a cellular switching center to a plurality of cell sites. As shown in FIG. 1, the GPS server 26 would transmit the position request either directly through the connection 25 or connection 25b or through the connection 27 and the network 28 to the cellular switching center 24 which would then cause the position request to be transmitted to the cell sites 13, 15, 19, and 21. In step 304, the cell sites transmit the position request and perhaps the cell site identity or cell site location or service area identity or location which contains the cell site to the specific mobile cellular based communication system. Again, it may be the case that the cell site transmission inherently contains cell site location and/or identity, as in the aforementioned IS-95 CDMA standard; hence, no special action is required of the cell site in such situations. In step 306, the specific cellular based communication system responds to a cell site which communicates with the specific system. This response may include sending the cell site identification or cell site location or service area identity or location which contains the cell site to the SPS server through the cell site. In step 308, the SPS server receives information specifying the specific cellular based communication system and at least one of the cellular site identification, or cell site location, or the service area identification or location. The SPS server then determines a plurality of approximate Dopplers to a corresponding plurality of satellites in view of the cell site which is communicating with the specific mobile cellular based communication system from at least one of the cell site identification or cell site location or service area identification or location. Typically, the time of the day will also be used to determine the approximate Doppler if a database having this information is not available to the SPS server. In step 310, the SPS server transmits approximate Dopplers to the cellular based communication system typically through the cell site. Then in step 312, the cellular based communication system uses the approximate Dopplers for its SPS receiver.

Figure 4B:
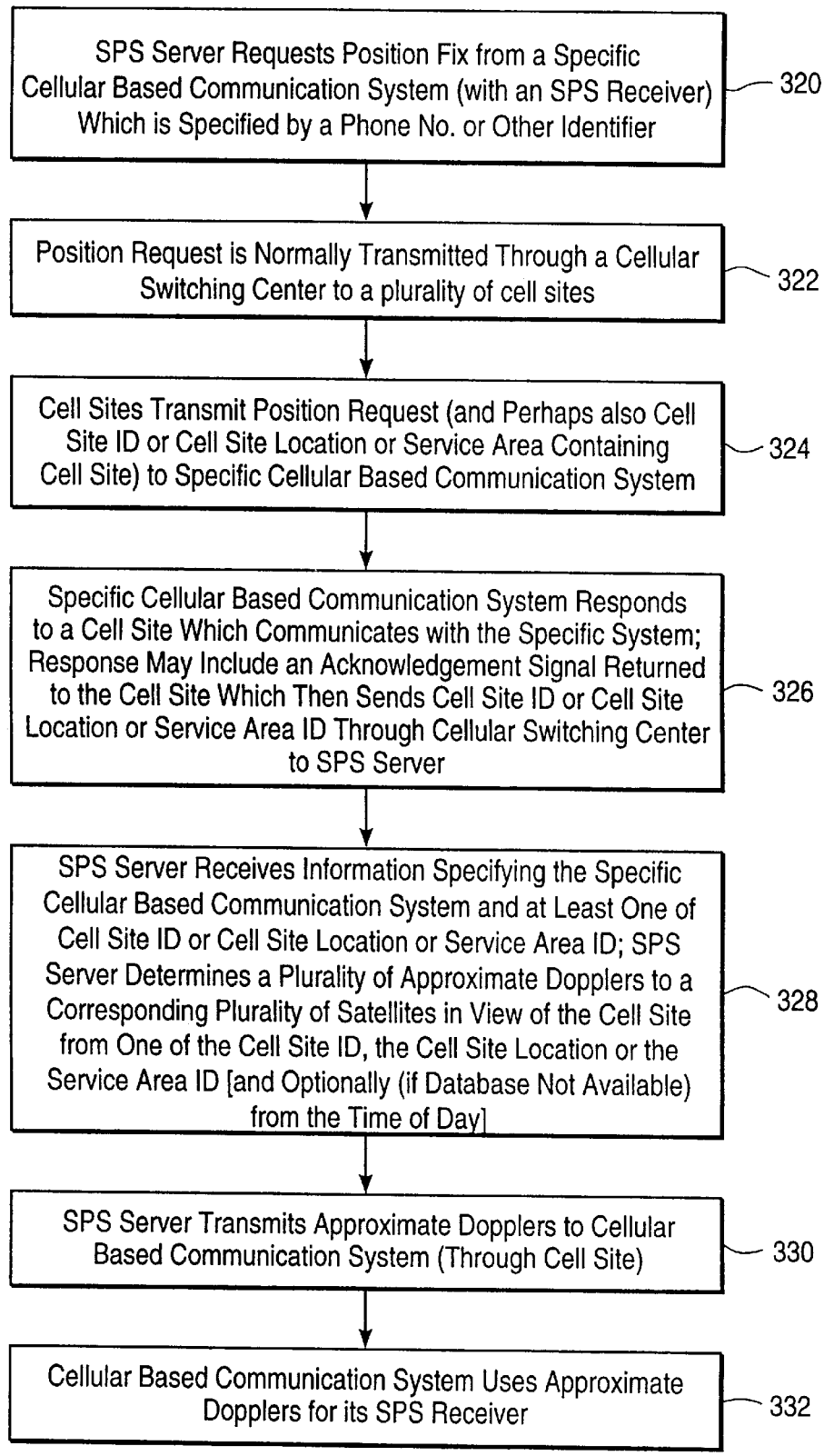
FIG. 4B illustrates another implementation according to the present invention in which a cellular based information source is used to derive approximate Doppler information.

FIG. 4B shows yet another implementation of a method according to the present invention in which a cellular based information source is used to obtain an approximate location which is then used to derive approximate Dopplers for use in an SPS receiver which is in communication with cell sites or a cell site in a cellular based communication system. The method of FIG. 4B begins in step 320 in which the SPS server requests a position fix from a specific mobile cellular based communication system which includes an SPS receiver. Typically, this mobile cellular based communication system is specified by a phone number or other identifier. In step 322, the position request is normally transmitted through a cellular switching center to a plurality of cell sites. For example, as shown in FIG. 1, the SPS server 26 may transmit the position request directly to the cellular switching center 24 through the communication link 25 or indirectly through the link 27, the network 28, and the link 30. Then the cellular switching center 24 will convey the position request to various cell sites. It will be appreciated that the position request asserted by the SPS server in step 320 may actually initiate from a query terminal 29 which may be a computer system operated by a user who desires to know the location of a particular mobile cellular based communication system, such as the mobile GPS receiver 16, or the mobile receiver 17 as shown in FIG. 1. It will be appreciated that an alternative of the method of FIG. 3C may also be used in the situation of FIG. 4A where the SPS server (or some other system) requests the position of the mobile SPS receiver.

In step 324, the cell sites having received the position request, transmit the position request and perhaps also transmit the cellular site identification or cellular site location or service area location or identification which contains the cell site to the specific mobile cellular based communication system. In step 326, the specific mobile cellular based communication system responds to a particular cell site which communicates with the specific system. This response may include an acknowledgment signal (or the optionally transmitted information such as cell site identity) which is returned to the cell site which then sends the cell site identification or cell site location or service area identification or location through the cellular switching center to the SPS server. In step 328, the SPS server receives the information which specifies the specific mobile cellular based communication system and also receives at least one of the cell site identification or cell site location or service area identification or location. Then the SPS server determines a plurality of approximate Dopplers to a corresponding plurality of satellites in view of the cell site (or approximate location) from one of the provided information such as the cellular site identification or the cellular site location or the cellular service area identification or location. Typically, the SPS server will also determine the time of day which is used to select the particular set of Dopplers for the approximate location at the given time of day. In step 330, the SPS server transmits the approximate Doppler information to the cellular based communication system through the cellular switching center and the particular cell site which is in communication with the specific mobile cellular based communication system. In step 332, the mobile cellular based communication system uses the approximate Dopplers for its SPS receiver in the manner described herein.

FIG. 5 shows an example of a cellular based information source which in one embodiment may be maintained at an SPS server such as the GPS server 26 shown in FIG. 1. Alternatively, this information source may be maintained at a cellular switching center such as the cellular switching center 24 of FIG. 1 or at each cell site, such as cell site 13 shown in FIG. 1. Typically, however, this information source is maintained and routinely updated at the SPS server which is coupled to the cellular switching center. The information source may maintain the data in various formats and it will be appreciated that the format shown in FIG. 5 illustrates only one example of this format. Typically, each set of Doppler information at a particular time, such as Doppler set A1 at time T1 will include a corresponding location or identification for a cell site or a service area. For example, in the case of Doppler sets A1 and A2 there is a corresponding identification of the cellular service area A as well as the latitude and longitude for this service area. It will be appreciated that typically this latitude and longitude will be an "average" location which is generally centrally located within the geographical region of the cellular service area. However, other possible approximations may be utilized particularly where the cellular service area includes terrains which are not used. As shown in FIG. 5, the cellular based information source includes a column specifying the cellular service area, column 325a, and a column 325b specifying a cellular site identification or number. Note that for cellular service area A there is no specification of the cell site identification or location and thus the approximate location is based upon a location for the cellular service area and thus the approximate Dopplers A1 and A2 are based upon this location depending on the particular time of day designated by the times T1 and T2. The column 325c includes a specification of the latitude and longitude for the particular location of the service area, and column 325d includes a specification of the latitude and longitude for the location of the particular cell site within the cellular service area.

Figure 6:
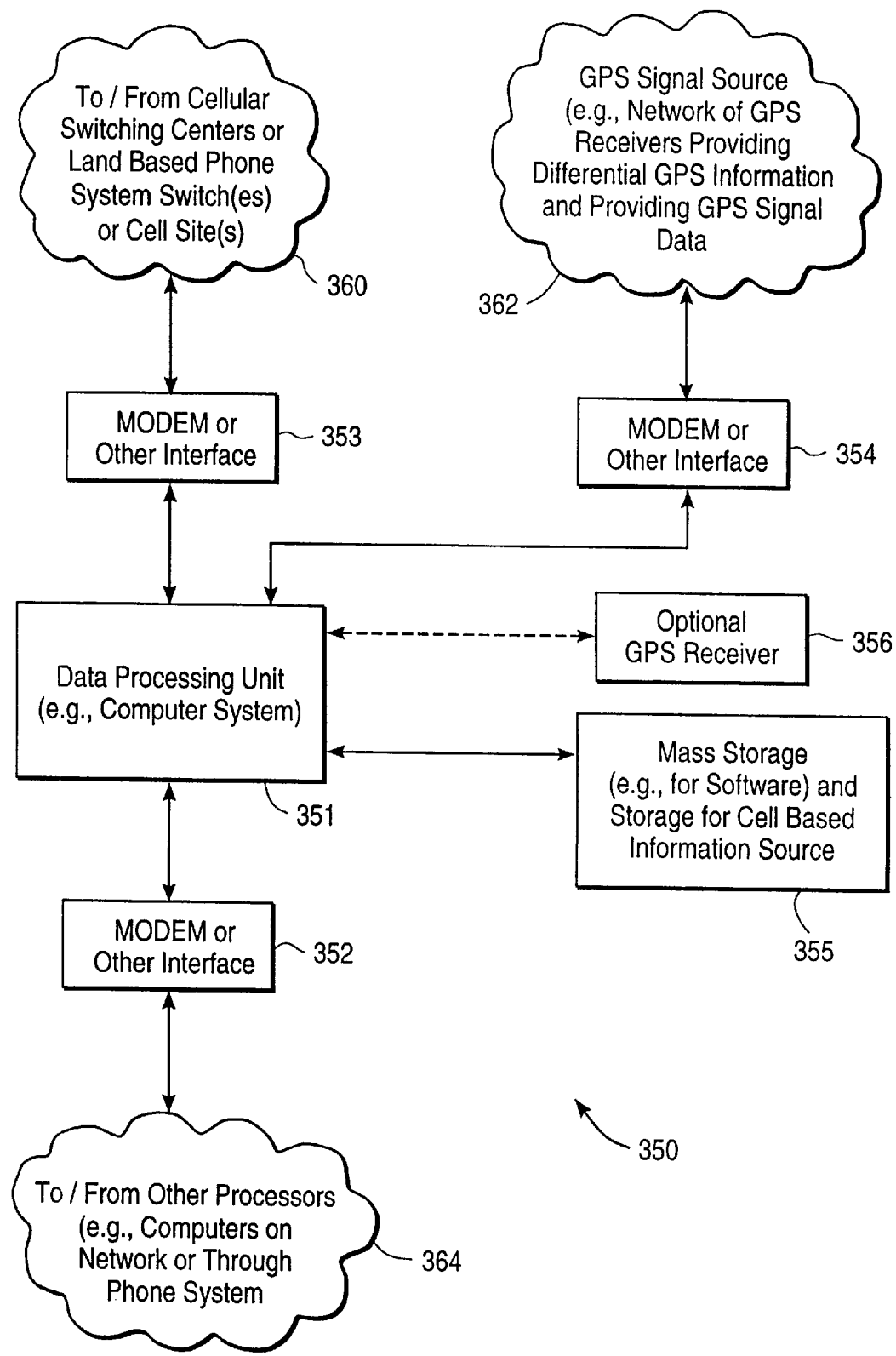
FIG. 6 illustrates an implementation of a basestation system according to one embodiment of the present invention.

FIG. 6 shows an example of an SPS server 350 of the present invention, which includes 6 elements. These elements are the data processing unit 351, which may be a computer system, the modem or other interface 352, the modem or other interface 353, the modem or other interface 354, the mass storage device 355, and optionally a GPS receiver 356. This SPS server 530 may be coupled to three different networks shown as networks 360, 362, and 364. In particular, the network 360 includes the cellular switching center or centers and/or the land based phone system switches or the cell sites. An example of this network is shown in FIG. 1 wherein the GPS server 26 represents the SPS server 350 of FIG. 6. Thus the network 360 may be considered to include the cellular switching centers 24 and 24b and the land based telephone system/network 28 and the cellular service area 11 as well as cells 18 ad 20. The network 364 may be considered to include the query terminal 29 of FIG. 1 as well as other computer systems which are coupled to the GPS server 26 and which may be used to query the GPS server 26 in order to obtain position information from the mobile SPS receivers located in the various cells of the cellular based communication system.

The network 362, which is not shown in FIG. 1, is a network of GPS receivers which provide differential correction GPS information and which provide GPS signal data (e.g. ephemeris) to the data processing unit. The provision of GPS signals from this network 362 may not be necessary when the GPS receiver 356 is provided at the SPS server 350. If the server serves a very large geographical area, however, a local receiver 356 will not be able to observe all GPS satellites that are in view of mobile SPS receivers throughout this area.

As shown in FIG. 6, the mass storage 355 in one embodiment will include storage for software for performing the GPS position calculations after receiving pseudoranges from the mobile GPS receivers, such as the receiver 16, through the cell site and cellular switching center and the modem or other interface 353. The mass storage 355 also includes storage for the cell based information source, such as the information source shown in FIG. 5.

It will be appreciated that the data processing unit 351 may be a conventional digital computer system, and the optional GPS receiver 356 may be a conventional GPS receiver which provides an output having Doppler and/or other satellite data such as satellite ephemeris data which is provided as an input to the data processing unit. It will be appreciated that the satellite ephemeris data is used in a conventional manner with the pseudoranges obtained from the mobile GPS receiver in order to compute the position information (e.g. latitude, longitude and optionally altitude) for the mobile GPS receiver. The interfaces 352, 353, and 354 may each be a modem or other suitable interface for coupling the data processing unit to other computer systems in the case of the network 364 and to cellular based communication systems in the case of modem 353 and the network 360. Similarly, the modem or other interface 354 provides a connection between the GPS signal source which may be a network of GPS receivers providing location appropriate differential correction GPS information. It will be appreciated that this network 362 includes a dispersed collection of GPS receivers dispersed over a geographical region and that the differential correction GPS information obtained from a receiver near the cell site or cellular service area which is communicating with the mobile GPS receiver through the cellular based communication system will provide differential correction GPS information which is appropriate for the approximate location of the SPS receiver.

FIG. 7A shows a generalized combined GPS and communication transceiver system. The system 375 includes a GPS receiver 376 having a GPS antenna 377 and a communication transceiver 378 having a communication antenna 379. The GPS receiver 376 is coupled to the communication transceiver 378 through the connection 380 shown in FIG. 7A. In normal operation, the communication system transceiver 378 receives approximate Doppler information through the antenna 379 and provides this approximate Doppler information over the link 380 to the GPS receiver 376 which performs the pseudorange determination by receiving the GPS signals from the GPS satellites through the GPS antenna 377. Various embodiments for the combined system 375 are known in the art and have been described in the above referenced co-pending applications.

Figure 7B:
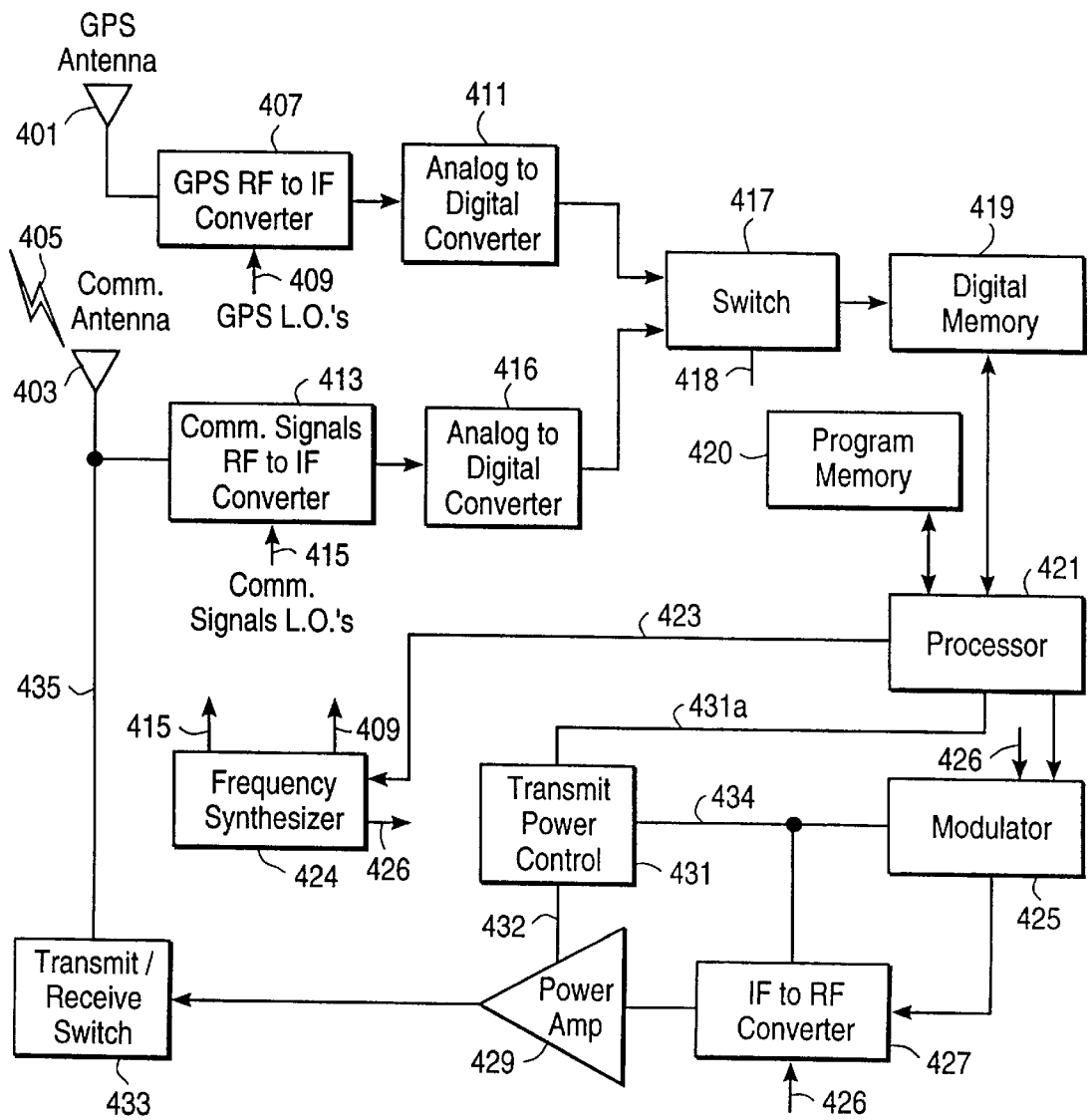
FIG. 7B illustrates another embodiment of an SPS receiver with an integrated communication system according to one embodiment of the present invention.

FIG. 7B shows a particular example of an integrated GPS and communication system having shared circuitry between the two systems. This particular example of a combined GPS and communication system has been described in co-pending application Ser. No. 08/652,833, which was filed May 23, 1996, now U.S. Pat. No. 6,002.363, and is hereby incorporated herein by reference. The system 375 of FIG. 7A or the system shown in FIG. 7B, as well as numerous alternative communication systems having SPS receivers, may be employed with the methods of the present invention to operate in cellular based communication systems.

Figure 8:
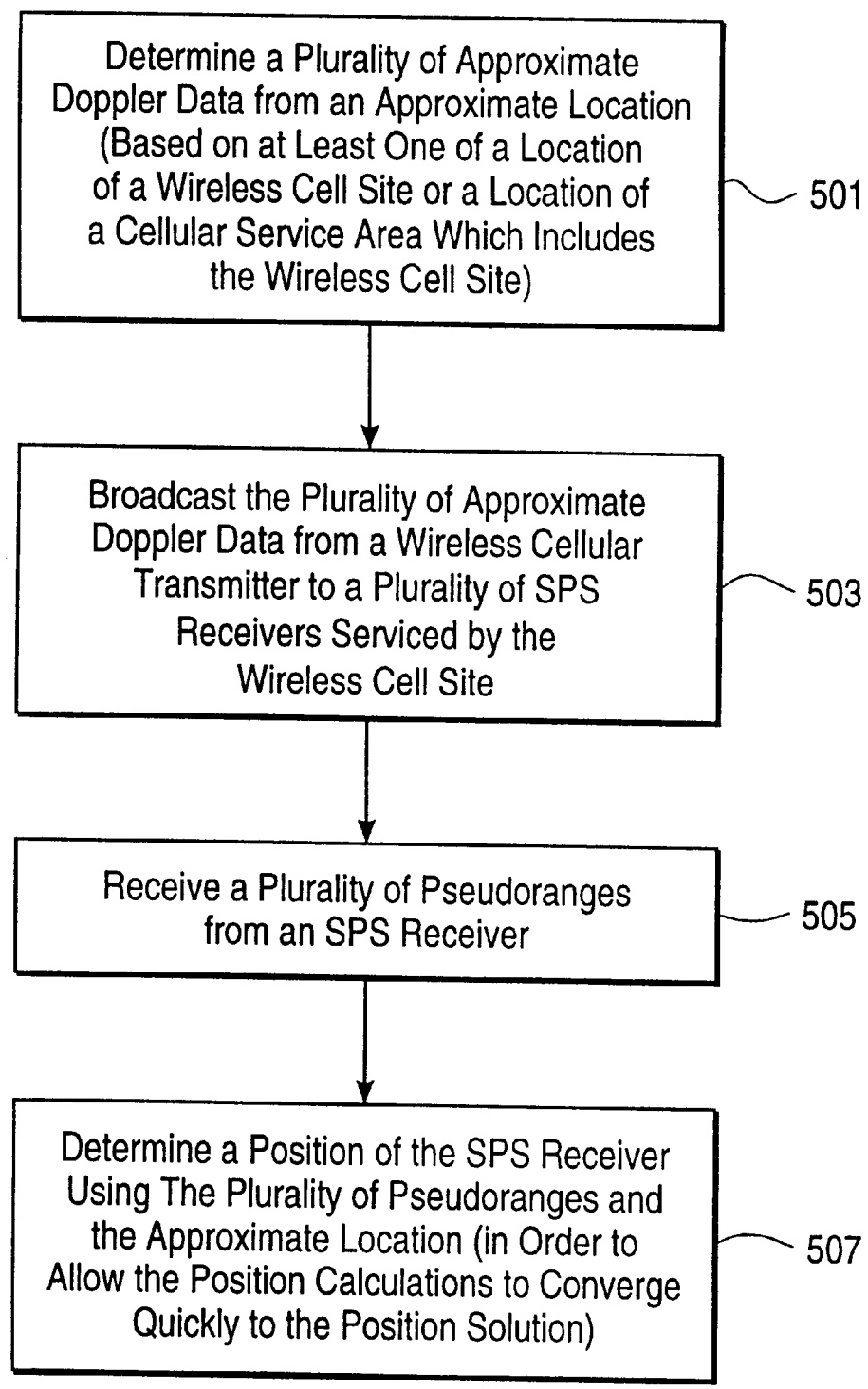
FIG. 8 is a flowchart showing a method of broadcasting approximate Doppler information according to one embodiment of the present invention.

Another aspect of the present invention is shown in FIG. 8 which relates to the broadcasting of a plurality of approximate Doppler data from a wireless cellular transmitter. This method utilizes a location from the cellular based network to determine a plurality of approximate Doppler data. The method begins in step 501 in which a plurality of approximate Doppler data is determined from an approximate location. This location is based typically on at least one of a location of a wireless cell site or a location of a cellular service area which includes the wireless cell site. This approximate location represents the approximate location of an SPS receiver in the cell site or the cellular service area. It will be appreciated that the location of a fixed wireless cell site is known; however, the approximate location referred to here is the approximate location of the SPS receiver based upon the location of the wireless cell site or the cellular service area. In step 503, the plurality of approximate Doppler data is broadcast from a wireless cellular transmitter to a plurality of SPS receivers which are serviced by the wireless cell site. In step 505, the wireless cell site receives a plurality of pseudoranges from an SPS receiver. Typically, this information is forwarded to a GPS server which combines the plurality of pseudoranges with the ephemeris data in order to determine the position of the SPS receiver. Typically, as shown in step 507, the plurality of pseudoranges is used with the approximate location in order to determine the position of the SPS receiver. The approximate location allows the position calculations performed by the SPS server to converge quickly to a position solution.

Figure 9:
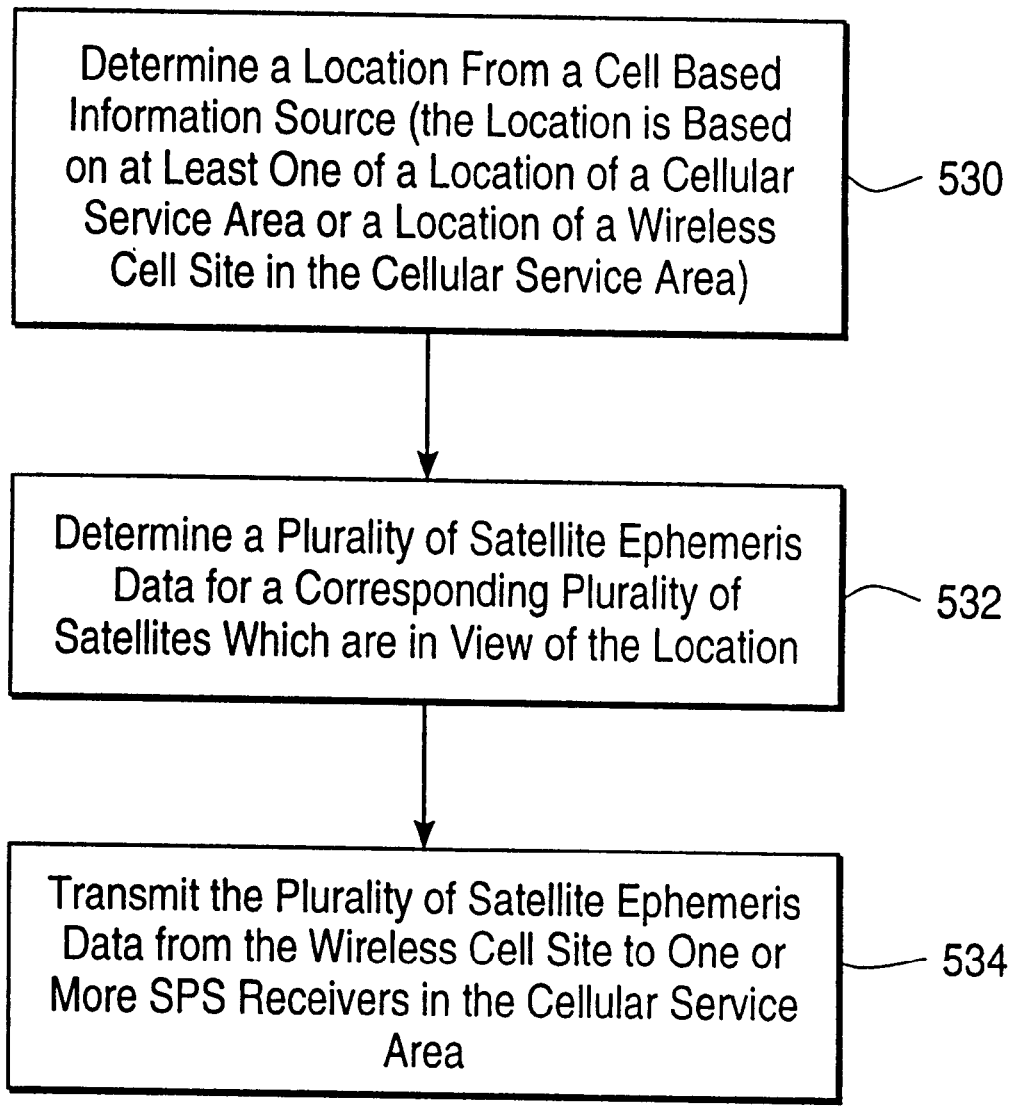
FIG. 9 is a flowchart illustrating a method according to one embodiment of the present invention in which a plurality of satellite ephemeris data which is appropriate for a particular cellular location, is transmitted from a wireless cellular transmitter site.

FIG. 9 illustrates another aspect of the present invention which relates to a method for transmitting location appropriate satellite ephemeris data from a wireless cell site, for which location appropriate satellite ephemeris data has been determined based upon a location from a cell based information source. The location represents an approximate location of an SPS receiver in the cell or cellular service area which is communicating with the SPS receiver. The location is determined in step 530 from a cell based information source. This location is based on at least one of a location of a cellular service area or a location of a wireless cell site in the cellular service area and again represents the approximate location of the SPS receiver being serviced by the wireless cell site. In step 532, a plurality of satellite ephemeris data is determined for a corresponding plurality of satellites which are in view of the location determined in step 530. Then, in step 534, the plurality of satellite ephemeris data is transmitted from the wireless cell site to an SPS receiver in the cellular service area. In this manner, an SPS receiver may use the ephemeris data along with pseudoranges determined at the SPS receiver in order to calculate the position of the SPS receiver rather than the circumstance where a remote processing station such as the GPS server 26 performs the position calculation. The method of FIG. 9 may alternatively be used in a way in which the satellite ephemeris data is used to calculate Doppler at the SPS receiver and the SPS receiver uses the approximate Doppler information to reduce processing time in determining pseudoranges at the SPS receiver; these pseudoranges are transmitted back to a GPS server which combines the satellite ephemeris data with the pseudoranges to determine a position information for the SPS receiver.

Another aspect of the present invention will now be described by referring to FIGS. 10A and 10B as well as FIGS. 11A and 11B. According to this aspect, methods and apparatuses are described for synchronizing a GPS local oscillator by means of synchronizing to cellular telephone signal modulation in the case of at least one embodiment.

Rapid signal acquisition of GPS signals by GPS receivers is aided by knowledge of the carrier frequency of these signals. The ideal carrier frequency, without Doppler and other effects is 1575.42 MHz. Satellite and GPS receiver location and motion result in a signal shift by up to approximately ±4 kHz. In addition, the stability of the local oscillator of the GPS receiver may contribute significant frequency errors. For example, a very stable temperature controlled crystal oscillator has stability of 1 part per million over a wide temperature range, which contributes to frequency error of up to ±1.6 kHz. Higher stability oscillators are available; however, such oscillators are expensive and high in power consumption. An alternative method for producing a stable local oscillator in the GPS receiver, when such a receiver is connected to a cellular telephone or other cellular communication device, such as a pager or data modem, is described here.

Most cellular communications signals, and especially digital types, are modulated onto carriers with high stability. A cellular receiver can phase or frequency lock to such a carrier and hence provide within the receiver a local oscillator with similarly high stability. This oscillator can be used as a reference in a frequency synthesizer to produce the stable local oscillator of the GPS signal. This approach has been previously described in co-pending U.S. patent applications Ser. No. 08/612,582, filed Mar. 8, 1996, now U.S. Pat. No. 5,874,914, and Ser. No. 08/759,523, filed Dec, 4, 1996, now U.S. Pat. No. 5,841,396. This method is referred to as the "carrier synchronization method" in the following discussion.

A problem with this carrier synchronization method is that cellular communication signals often utilize carrier frequencies that vary from transmission to transmission. Furthermore, some of these signals, also vary their carrier frequency within one transmission, so-called frequency hopping; an example of this is the GSM digital cellular standard widely utilize in Europe. These frequency variations may add complexity to the synchronization approach described above, based upon the signal's carrier frequency. In addition, the carrier synchronization method may involve significant modification to a cellular receiver's frequency synthesis circuits, which may incur high costs and/or performance limitations.

An alternative to the carrier synchronization method, which is the subject of an aspect of the current invention, is the "modulation synchronization method." In this method, a stable frequency is derived from the received cellular signal after its carrier has been removed. Most digital cellular systems employ high stable modulation rates in order to allow the transmission of digital data in a shared or "multiplexed" condition with other transmissions. One example of this is the aforementioned GSM signal which transmits signals in time slot bursts lasting 0.577 milliseconds and having a data rate of approximately 270.83 kHz (more precisely 13/48×1 MHz). The data within each such burst is transmitted using Gaussian minimum shift keying (GMSK), which is a form of frequency shift keying. A second example is the code division multiple access (CDMA) digital cellular standard for North America, IS-95 which utilizes spread spectrum signaling. In this system a high rate phase shift keyed "spreading sequence" is modulated onto a carrier at a rate 1.2288 MHz. This rate is very stable and the timing of the symbols, or "chips", making up the signal is linked to the very stable Global Positioning System. In both of these examples, a local oscillator in the GPS receiver may be phase or frequency locked to one of these modulation rates, thus providing high stability to the local oscillator.

Advantages of the modulation synchronization method include (A) the modulation rate is independent of the carrier frequency of the transmission, and (B) providing this modulation rate to the GPS receiver often requires little change to the cellular receiver's frequency synthesis circuits. In many cases it is expected that these advantages will lead to lower costs than the carrier synchronization method, although the lower frequency of the modulation rate may make it more susceptible to various sources of noise and jitter.

Two examples of the modulation synchronization method will be provided here to show embodiments of the current invention. FIG. 10A shows an apparatus which may employ the method applied to the situation for the IS-95 CDMA cellular standard. A signal from the cell basestation (e.g. cell site 13) is received by the antenna 101, converted to an appropriate IF via RF to IF converter 102 and sent to PN acquisition and tracking circuit or subsystem 103, all of which are a part of the cell phone receiver 120. The PN acquisition circuit acquires and tracks the CDMA pseudorandom sequence (frequency and phase) that is modulated onto the carrier at a rate of 1.2288 MHz. In a typical implementation this tracking is done using a voltage controlled, or tunable, oscillator 104 which drives a PN generator. This VCO 104 may be implemented in analog or digital form. Often this oscillator is adjusted in frequency to be twice that of the received PN rate; this permits continuous tracking of the PN signal. In FIG. 1, the VCO 104 is run at twice the PN, or chip, rate, i.e. 2.4567 MHz. It is well-known in the art that utilizing a clock rate at twice (or a multiple thereof of) the received chip rate enables construction of a good quality tracking system utilizing an early/late PN tracking loop.

As mentioned the received CDMA signal has a highly stable PN modulation, locked to GPS time (except under certain outage conditions). Hence, the supplied 2.4567 MHz clock from the PN acquisition circuit will normally have very good long term stability.

Its short term stability, or phase noise, is primarily a function of the quality of the tracking loop described above. This clock may be provided to a phaselock loop circuit 121 whose purpose is to phase and frequency lock a second oscillator 109 to this clock. This second oscillator has frequency 4.096 MHz and is used as the frequency reference for the GPS receiver frequency synthesizer 112. This frequency is a multiple of 1.024 MHz, which may be used in GPS systems and is described in detail in co-pending patent application Ser. No. 08/612,669, referred to above (filed on Mar. 8, 1996). The PN VCO frequency 2.4576 MHz when divided by 3 equals 819.2 kHz, which is identical to the GPS reference frequency 4.096 MHz divided by 5. Hence use of two dividers 105 and 106 in the phaselock loop 121 together with a conventional phase detector 107 and loop filter 108 enable the phaselocking of oscillator 109 to 104 in a conventional manner. This circuitry is very simple and inexpensive to construct, especially in integrated circuit form.

The phaselocked oscillator 109 is used as a reference for GPS frequency synthesizer 112 which produces local oscillators for a GPS RF to IF converter 111 and sample clock for the GPS signal processor 113. In particular a 4.096 MHz sample clock is suitable for processing the GPS signals, as explained in the above referenced patent application Ser. No. 08/612,669, filed Mar. 8, 1996.

The application of this invention to the GSM signaling format is similar to the CDMA, except that the primary symbol modulation rate of GSM, namely 270.833 kHz does not have suitable common factors with the abovementioned GPS receiver reference frequency 4.096 MHz. However, alternative GPS receiver implementations may be utilized which do have good common factors. For example some GPS receivers utilize a 10 MHz reference oscillator. Since 270.833 kHz times 48/13 equals 1 MHz, it is easy to phaselock a 10 MHz reference oscillator to the GSM symbol rate by an approach similar to FIG. 10A.

Figure 10A:
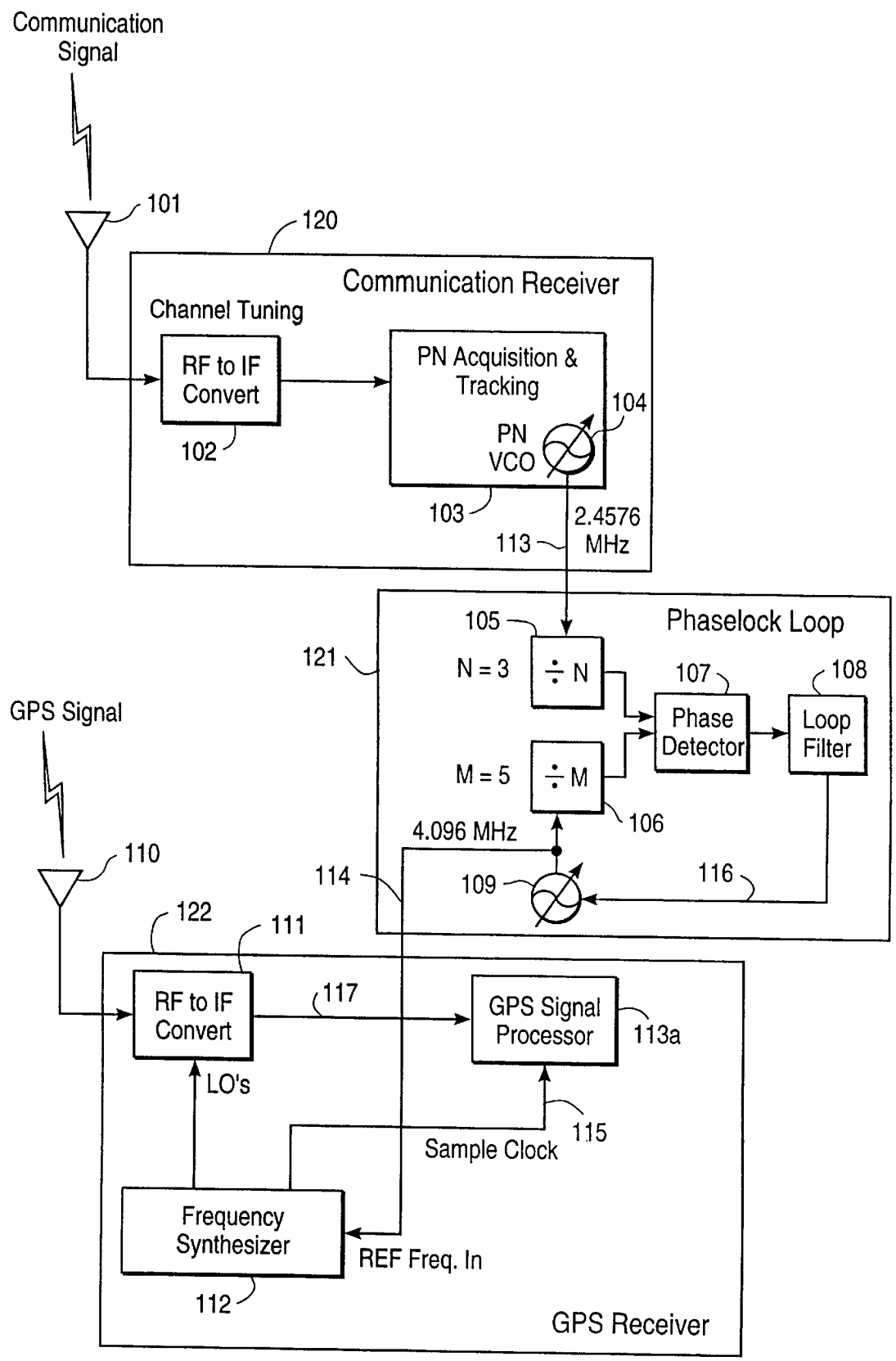
FIG. 10A shows an example of a combined communication receiver and SPS receiver in which a data signal which is modulated on a carrier frequency of a communication signal is used to provide a reference signal which in turn is used to provide a local oscillator signal which is used to acquire SPS signals in the SPS receiver.

However, even if a 4.096 MHz reference is utilized by the GPS, it is still possible to slightly modify the system of FIG. 10A to accommodate this situation. This is illustrated in FIG. 10B. Here the VCO 204 in the communication receiver 220 is locked to 8 times the TDMA symbol rate by the acquisition and tracking circuit 203. The VCO output from VCO 204 is supplied to a direct digital frequency synthesizer 221a (DDS), sometimes referred to as a numerically controlled oscillator (NCO). This device, well-known in the art, consists of a digital phase accumulator, a sine lookup table to generate digital samples of a sinusoid, and a D/A converter and lowpass filter to create an analog signal from the digital samples. In the example of FIG. 10B, the DDS is programmed to frequency 0.23631 as a fraction of the input frequency 2.167 MHz, so that a 512 kHz output is produced. The frequency synthesizer 212 can utilize the 512 kHz reference of FIG. 10B in a manner similar to the 4.096 MHz of FIG. 10A, since the latter is a multiple of the former. A disadvantage of the DDS is some applications is that it may be more costly than a standard analog phaselock loop; however, in some cases this cost, which is dominated by the cost of the aforementioned D/A converter, may be reduced by using a single bit D/A converter. This requires a judicious choice of the exact programmed frequency of the DDS so that resulting spurs are outside the loop bandwidth of the frequency synthesizer 212 which is phaselocked to this reference.

Figure 10B:
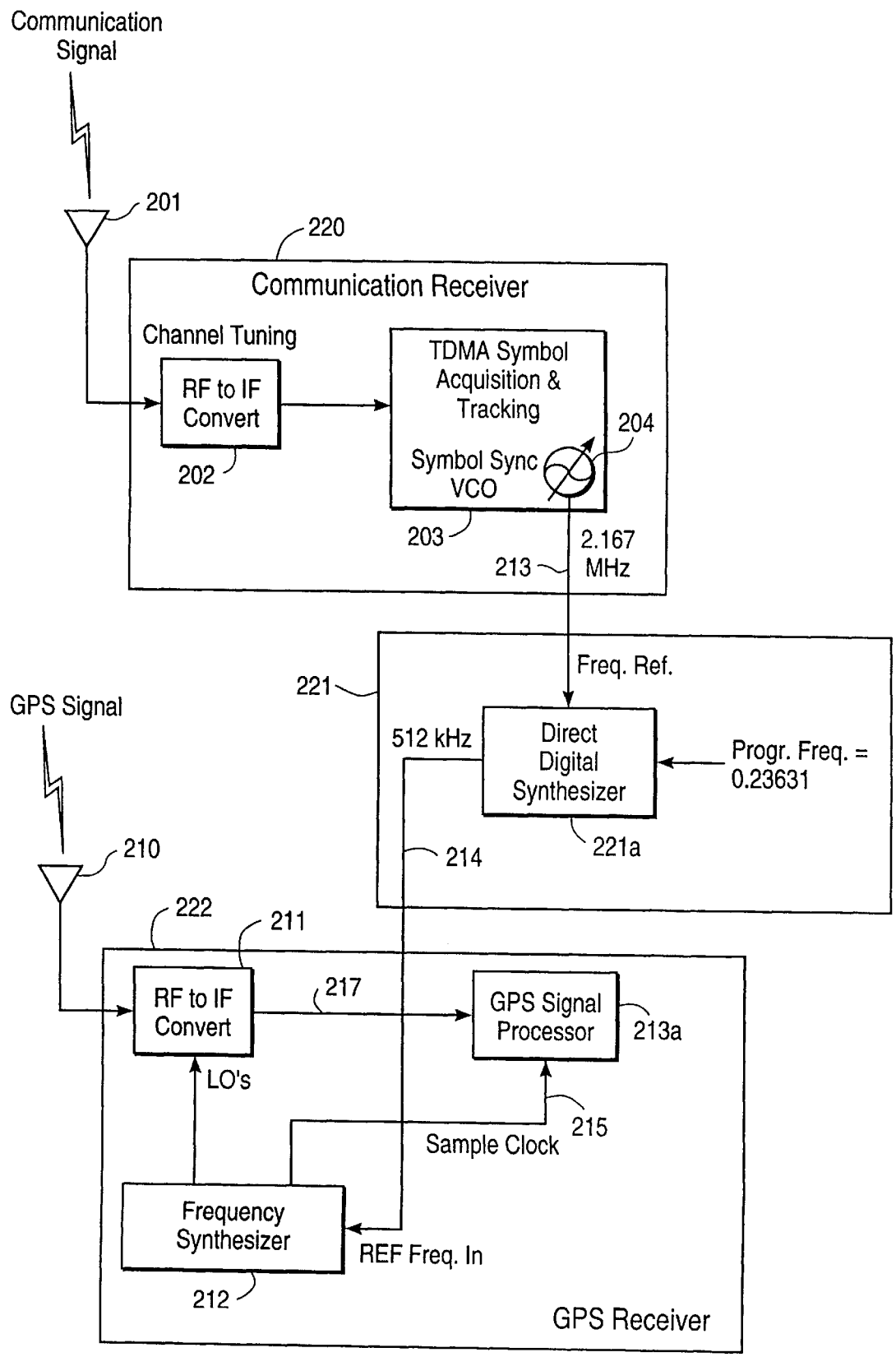
FIG. 10B shows another embodiment of the present invention in which data signals modulated on a communication signal are used to derive a local oscillator signal which is used to acquire SPS signals in an SPS receiver.
Figure 11A:
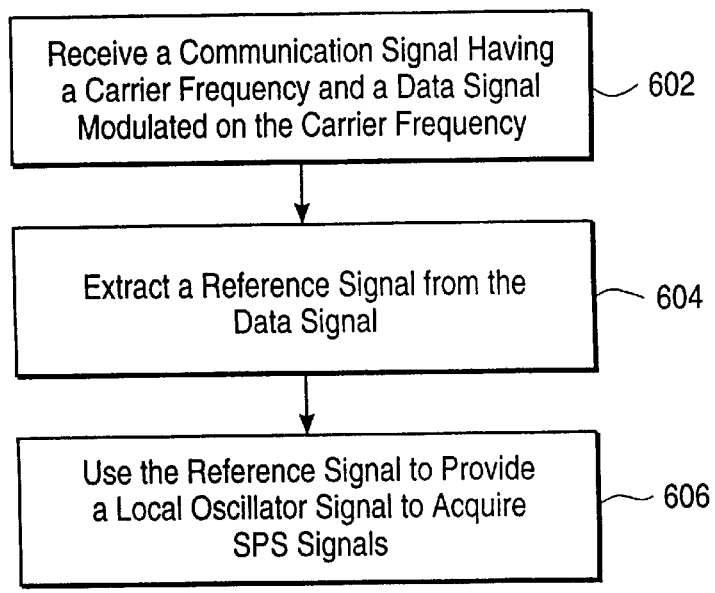
FIG. 11A illustrates a generalized method of the present invention in which a reference signal is extracted from a data signal that is modulated on a carrier frequency of a communication signal in order to provide a local oscillator signal to acquire SPS signals.
Figure 11B:
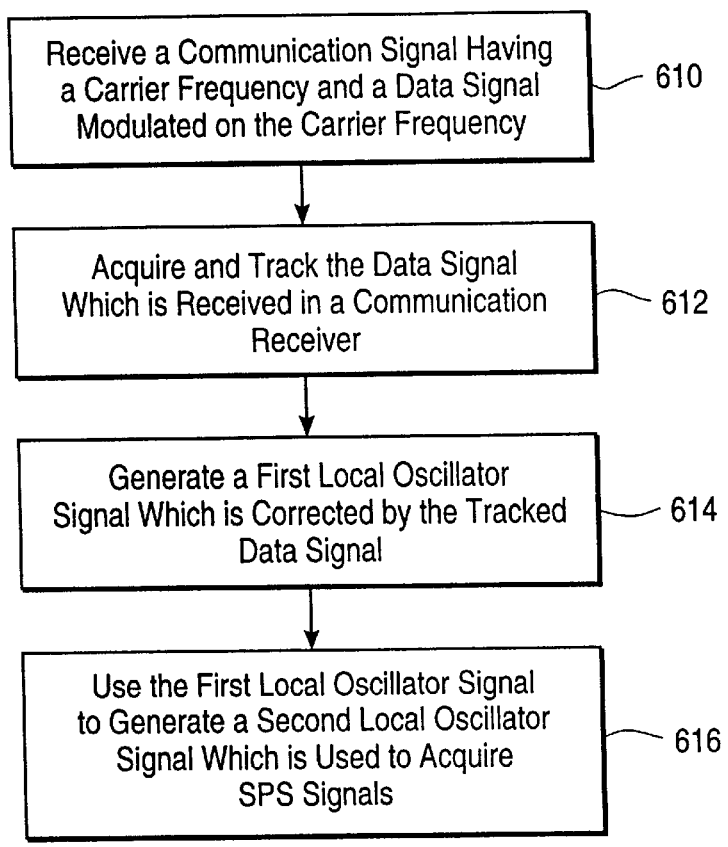
FIG. 11B shows a particular implementation of the method shown in FIG. 11A.

FIG. 11A illustrates a generalized method performed according to the present invention by the systems shown in either FIGS. 10A or 10B. In step 602, the communication signal is received. This communication signal has a data signal modulated on a carrier frequency. A reference signal is extracted from the data signal in step 604. This reference signal in the examples of FIGS. 10A and 10B is the output from the VCO in the transition and tracking circuitry of the communication receiver. This reference signal is used in step 606 to provide a local oscillator signal to acquire the SPS signals. The examples of FIGS. 10A and 10B illustrate two examples in which the reference signal may be used. In one case, the reference signal is used in a phaselock loop to generate another clock output which is used as a reference for a frequency synthesizer which drives the RF to IF converter as shown in FIG. 10A. FIG. 11B shows a more specific implementation of the present invention in one embodiment. In this embodiment, the data signal which is modulated onto the carrier frequency is acquired and tracked. A first local oscillator signal is generated which is corrected by the tracked data signal. The first local oscillator signal is then used to generate a second local oscillator signal which is used to acquire the GPS signals from GPS satellites.

It will be appreciated that the Doppler information which is transmitted to an SPS receiver according to the present invention may include not only approximate Dopplers relative to each satellite in view of the SPS receiver, but also the rate of change for each approximate Doppler. The approximate Doppler information may alternatively be expressed in the form of quadratic equations or more sophisticated mathematical representations which may be valid for approximately one-half hour from the time in which they were originally determined.

Approximate Doppler may be computed by computing the range from the remote to the satellites of interest at times separated by an appropriate interval (e.g. 1 second). This is done utilizing the supplied Almanac data and the approximate user position (e.g., based upon the fixed location of the cell site in a cellular phone system). The difference in these ranges is a range rate, which can be divided by the speed of light to yield a Doppler expressed in seconds per second (or another suitable set of units such as nanoseconds per second).

Although the methods and apparatus of the present invention have been described with reference to GPS satellites, it will be appreciated that the teachings are equally applicable to positioning systems which utilize pseudolites or a combination of satellites and pseudolites. Pseudolites are ground based transmitters which broadcast a PN code (similar to a GPS signal) modulated on an L-band carrier signal, generally synchronized with GPS time. Each transmitter may be assigned a unique PN code so as to permit identification by a remote receiver. Pseudolites are useful in situations where GPS signals from an orbiting satellite might be unavailable, such as tunnels, mines, buildings or other enclosed areas. The term "satellite", as used herein, is intended to include pseudolite or equivalents of pseudolites, and the term GPS signals, as used herein, is intended to include GPS-like signals from pseudolites or equivalents of pseudolites.

In the preceding discussion the invention has been described with reference to application upon the United States Global Positioning Satellite (GPS) system. It should evident, however, that these methods are equally applicable to similar satellite positioning systems, and in, particular, the Russian Glonass system. The Glonass system primarily differs from GPS system in that the emissions from different satellites are differentiated from one another by utilizing slightly different carrier frequencies, rather than utilizing different pseudorandom codes. In this situation substantially all the circuitry and algorithms described previously are applicable with the exception that when processing a new satellite's emission a different exponential multiplier corresponding to the different carrier frequencies is used to preprocess the data. The term "GPS" used herein includes such alternative satellite positioning systems, including the Russian Glonass system.

It will be appreciated that the various aspects of the present invention may be used in GPS mobile units having architectures such as those described in U.S. patent application Ser. No. 08/652,833, filed May 23, 1996by Norman F. Krasner, now U.S. Pat. No. 6,002,363 which application is hereby incorporated herein by reference.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for reducing processing time in a satellite positioning system (SPS) receiver having a cell based communication receiver, said method comprising:

determining an approximate location of said SPS receiver from a cell based information source, said approximate location being determined by at least one of a location of a cellular service area which includes a cell site or a location of said cell site;

determining an approximate Doppler for at least one SPS satellite relative to said SPS receiver, said approximate Doppler being based on said approximate location;

using said approximate Doppler in said SPS receiver to reduce processing time in one of either determining at least one pseudorange to said at least one SPS satellite or acquiring signals from said at least one SPS satellite and wherein said at least one SPS satellite transmits ephemeris data for said at least one SPS satellite and wherein said SPS receiver and said cell based communication receiver do not use a common communication link.

2. A method as in claim 1 further comprising:

transmitting said approximate Doppler from said cell site to said cell based communication receiver and wherein said cell site is capable of communicating with said cell based communication receiver.

3. A method as in claim 2 wherein said approximate location is determined by either a selected position in a general geographical region defined by said cellular service area or said location of said cell site which is located in a portion of said general geographical region.

4. A method as in claim 2 further comprising:

transmitting said at least one pseudorange from said SPS receiver to a remote processing station.

5. A method as in claim 4 wherein said transmitting step is through said cell site.

6. A method as in claim 5 wherein said remote processing station is located at said cell site.

7. A method as in claim 5 wherein said remote processing station is coupled to a cellular switching center.

8. A method as in claim 7 wherein said approximate Doppler is determined by said remote processing station.

9. A method as in claim 8 wherein said remote processing station receives said approximate location from said cell site and provides said approximate Doppler to said SPS receiver through said cell site.

10. A method as in claim 8 wherein said remote processing station receives a cell site identifier from said cell site and determines said approximate location from said cell site identifier and provides said approximate Doppler to said SPS receiver through said cell site.

11. A method as in claim 10 wherein said remote processing station comprises a storage device having a table which relates said cell site identifier to said approximate location and wherein said remote processing station has access to information specifying a plurality of approximate Dopplers at a given time for said approximate location.

12. A method as in claim 1 further comprising:

transmitting said at least one pseudorange from said SPS receiver to a remote processing station through said cell site, and wherein said cell based communication receiver is integrated in one enclosure with said SPS receiver.

13. A method as in claim 12 wherein said remote processing station is coupled to a cellular switching center which is coupled to a plurality of cell sites, including said cell site.

14. A method as in claim 1 wherein said cell based communication receiver determines said approximate location from a cellular transmission from at least said cell site and wherein said cell based communication receiver transmits said approximate location to a remote processing station which determines said approximate Doppler and causes said approximate Doppler to be transmitted from said cell site to said cell based communication receiver.

15. A method as in claim 1 further comprising:

transmitting said approximate Doppler from said cell site to said cell based communication receiver, wherein said approximate Doppler is determined by a remote processing station which is coupled to said cell site and which receives an identifier of at least one of said cellular service area or said cell site from said cell based communication receiver.

16. A method as in claim 15 wherein said remote processing station determines said approximate Doppler from said identifier which is transmitted by said cell based communication receiver to said remote processing station.

17. A method as in claim 16 wherein said identifier is provided by said cell site to said cell based communication receiver, and said cell based communication receiver transmits said identifier through said cell site to said remote processing station.

18. A method as in claim 16 wherein said cell based communication receiver derives said identifier from a signal transmitted by said cell site to said cell based communication receiver.

19. A method as in claim 18 wherein said signal is a pseudorandom (PN) code which corresponds to said cell site.

20. A method as in claim 19 wherein said signal is transmitted in a CDMA system.

21. A method as in claim 1 wherein said approximate Doppler is determined at a remote processing station which causes said approximate Doppler to be transmitted from said cell site to said cell based communication receiver, and wherein said cell based communication receiver causes said at least one pseudorange to be transmitted to said remote processing station which determines a position information for said SPS receiver using said at least one pseudorange, and wherein said SPS receiver uses said approximate Doppler without extracting satellite position data from SPS signals from SPS satellites.

22. A method as in claim 1 further comprising:

determining a reference signal from a communication signal transmitted from said cell site to said cell based communication receiver;

using said reference signal to provide a local oscillator signal which is used to acquire SPS signals in said SPS receiver.

23. A method as in claim 22 wherein said reference signal is determined from a data signal modulated on a carrier frequency of said communication signal.

24. A method as in claim 22 wherein said reference signal is determined from a carrier frequency of said communication signal.

25. A method of using a data processing station which is coupled to at least one wireless cell site, said method comprising:
receiving a site information which determines an approximate location, said approximate location being determined by at least one of a location of a cellular service area which includes said wireless cell site or a location of said wireless cell site;
determining an approximate Doppler for at least one satellite positioning system (SPS) satellite, said approximate Doppler being based on said approximate location;
transmitting said approximate Doppler to said wireless cell site and wherein said at least one SPS satellite transmits ephemeris data for said at least one SPS satellite and wherein said at least one SPS satellite transmits signals to an SPS receiver which is coupled to a cell based communication receiver and wherein said SPS receiver and said cell based communication receiver do not use a common communication link.

26. A method as in claim 25 further comprising:
receiving at least one pseudorange from said wireless cell site, said pseudorange being provided by a satellite positioning system (SPS) receiver having a cell based communication receiver for communicating with said wireless cell site.

27. A method as in claim 26 further comprising:
transmitting a request for a position information from said SPS receiver, said request being transmitted to said wireless cell site.

28. A method as in claim 27 wherein said step of transmitting a request occurs after said step of transmitting said approximate Doppler.

29. A method as in claim 15 wherein said data processing station is coupled to a plurality of wireless cell sites.

30. A method as in claim 26 wherein said site information identifies said wireless cell site and wherein said data processing station determines said approximate location from said site information.

31. A method as in claim 26 wherein said site information provides said approximate location.

32. A method as in claim 26 wherein said data processing station accesses a storage device which contains information specifying a plurality of approximate Dopplers at a given time.

33. A method as in claim 26 wherein said approximate location and said at least one pseudorange are used to calculate a position information for said SPS receiver.

34. A method as in claim 26 further comprising:
transmitting a signal having a carrier frequency and a data signal modulated on said carrier frequency, said SPS receiver using one of said carrier frequency and said data signal to provide a local oscillator signal which is used to acquire SPS signals.

35. A data processing station comprising:
a processor;
a storage device coupled to said processor;
a transceiver coupled to said processor, said transceiver for coupling said data processing station to a wireless cell site, said storage device containing information specifying at least one approximate Doppler at a given time for an approximate location determined by at least one of a location of a cellular service area which includes said wireless cell site or a location of said wireless cell site, said transceiver receiving a site information which determines said approximate location, said processor determining an approximate Doppler for at least one satellite positioning system (SPS) satellite, said approximate Doppler being based on said approximate location, and said transceiver sending said approximate Doppler to said wireless cell site and wherein said at least one SPS satellite transmits ephemeris data for said at least one SPS satellite and wherein said at least one SPS satellite transmits signals to an SPS receiver which is coupled to a cell based communication receiver and wherein said SPS receiver and said cell based communication receiver do not use a common communication link.

36. A data processing station as in claim 35 further comprising:
a source of SPS signals coupled to said processor, and wherein said transceiver receives at least one pseudorange from said wireless cell site and wherein said processor uses said SPS signals and said at least one pseudorange to determine a position information for a satellite position system (SPS) receiver which communicates with said wireless cell site.

37. A data processing system as in claim 36 wherein said data processing system is coupled to another data processing system which issues a request to provide said position information to said another data processing system.

38. A data processing system as in claim 37 wherein said data processing system and said another data processing system are coupled through the Internet.

39. A data processing system as in claim 36 wherein said source of SPS signals comprises one or more SPS receivers.

40. A computer readable medium containing executable computer program instructions which, when executed by a data processing system, cause said data processing system to perform steps comprising:
receiving a site information which determines an approximate location, said approximate location being determined by at least one of a location of a cellular service area which includes a wireless cell site which is coupled to said data processing system or a location of said wireless cell site;
determining an approximate Doppler for at least one satellite positioning system (SPS) satellite, said approximate Doppler being based on said approximate location;
transmitting said approximate Doppler to said wireless cell site and wherein said at least one SPS satellite transmits ephemeris data for said at least one SPS satellite and wherein said at least one SPS satellite transmits signals to an SPS receiver which is coupled to a cell based communication receiver and wherein said SPS receiver and said cell based communication receiver do not use a common communication link.

41. A computer readable medium as in claim 40 wherein said steps further comprise:
receiving a source of SPS signals;
receiving at least one pseudorange from said wireless cell site;
processing said at least one pseudorange and said SPS signals to determine a position information for an SPS receiver which provided said at least one pseudorange.

42. A computer readable medium as in claim 41 wherein said approximate location and said SPS signals and said at least one pseudorange are processed to determine said position information.

43. A method for determining a position of a satellite positioning system (SPS) receiver having a wireless cell based transmitter, said method comprising:
- determining an approximate location of said SPS receiver from a cell based information source, said approximate location being determined by at least one of a location of a cellular service area which includes a wireless cell site which communicates with said wireless cell based transmitter or a location of said wireless cell site;
- receiving data from a source of SPS signals which includes ephemeris data for at least one SPS satellite;
- receiving a plurality of pseudorange data from said wireless cell based transmitter, said plurality of pseudorange data being determined by said SPS receiver;
- computing a position information of said SPS receiver by using SPS signals, said plurality of pseudoranges and said approximate location and wherein said SPS receiver and said wireless cell based transmitter do not use a common communication link.

44. A method as in claim 43 further comprising:
- transmitting a signal having a carrier frequency and a data signal modulated on said carrier frequency, said SPS receiver using one of said carrier frequency and said data signal to provide a local oscillator signal which is used to acquire SPS signals.

45. A method as in claim 43 further comprising:
- determining an approximate Doppler for at least one SPS satellite relative to said SPS receiver, said approximate Doppler being based on said approximate location;
- transmitting said approximate Doppler to said SPS receiver through said wireless cell site.

46. A method as in claim 45 further comprising:
- transmitting a signal having a carrier frequency and a data signal modulated on said carrier frequency, said SPS receiver using one of said carrier frequency and said data signal to provide a local oscillator signal which is used to acquire SPS signals.

47. A method for providing Doppler information to a satellite positioning system (SPS) receiver which is coupled to a cell based communication receiver, said method comprising:
- determining a plurality of approximate Doppler data from an approximate location based upon at least one of a location of a wireless cell site or a location of a cellular service area which includes said wireless cell site, said plurality of approximate Doppler data for a corresponding plurality of SPS satellites;
- broadcasting said plurality of approximate Doppler data from a wireless cellular transmitter of said wireless cell site to a plurality of SPS receivers in a cell serviced by said wireless cell site and wherein each of said plurality of SPS satellites transmits ephemeris data for said each of said plurality of SPS satellites and wherein said SPS receiver and said cell based communication receiver do not use a common communication link.

48. A method as in claim 47 further comprising:
- receiving at least one pseudorange from said wireless cell site, said pseudorange being provided by an SPS receiver having a cell based wireless transmitter which communicates with said wireless cell site.

49. A method as in claim 48 further comprising:
- computing a position information of said SPS receiver by using SPS signals from a source of SPS signals and using said pseudorange and said approximate location.

50. A method as in claim 48 further comprising:
- transmitting a signal having a carrier frequency and a data signal modulated on said carrier frequency, said SPS receiver using one of said carrier frequency and said data signal to provide a local oscillator signal which is used to acquire SPS signals.

51. A method for determining a position information of a mobile satellite positioning system (SPS) receiver having a cell based communication receiver, said method comprising:
- receiving a plurality of differential SPS correction data for a plurality of different locations;
- selecting a first differential SPS correction data for a first location from said plurality of differential SPS correction data, said first differential SPS correction data being selected based upon an approximate location which is determined from a cell based information source by at least one of a location of a cellular service area which includes a cell site or a location of said cell site;
- receiving a plurality of pseudorange data from said SPS receiver, said plurality of pseudorange data and said first differential SPS correction data being used to determine said position wherein said plurality of pseudorange data is derived from SPS signals transmitted from at least one SPS satellite and wherein said at least one SPS satellite transmits ephemeris data for said at least one SPS satellite and wherein said SPS receiver and said cell based communication receiver do not use a common communication link.

52. A method as in claim 51 further comprising:
- receiving satellite ephemeris data which is used to determine said position.

53. A method as in claim 52 wherein said position is determined at a data processing station which is capable of communicating with said cell based communication receiver through a cell based communication system which includes said cell site.

54. A method as in claim 53 wherein said SPS receiver provides a site information to said data processing station which uses said site information to determine said approximate location.

55. A method as in claim 54 further comprising:
- determining an approximate Doppler for at least one SPS satellite relative to said SPS receiver, said approximate Doppler being based on said approximate location;
- transmitting said approximate Doppler to said SPS receiver;
- using said approximate Doppler in said SPS receiver.

56. A method as in claim 53 further comprising:
- determining an approximate Doppler for at least one SPS satellite relative to said SPS receiver, said approximate Doppler being based on said approximate location;
- transmitting said approximate Doppler to said SPS receiver;
- using said approximate Doppler in said SPS receiver.

57. A method for determining Doppler information in a satellite positioning system (SPS) receiver having a cell based communication receiver, said method comprising:
- receiving, at said SPS receiver, satellite almanac information for a plurality of SPS satellites in view of said SPS receiver;
- determining an approximate location of said SPS receiver, said approximate location being determined by at least one of a location of a cellular service area which includes a cell site or a location of said cell site;
- using said satellite almanac information and said approximate location to determine an approximate Doppler for at least one of said SPS satellites and wherein each of said plurality of SPS satellites transmits ephemeris data for said each of said plurality of SPS satellites and wherein said SPS receiver and said cell based communication receiver do not use a common communication link.

58. A method as in claim 57 wherein said SPS receiver is a mobile SPS receiver and wherein said mobile SPS receiver receives said approximate location through a cellular signal which is received by said cell based communication receiver which is coupled to said mobile SPS receiver.

59. A method as in claim 57 wherein said SPS receiver is a mobile SPS receiver which determines its position using said approximate Doppler.

60. A method as in claim 57 wherein said SPS receiver determines at least one pseudorange to satellites in view using said approximate Doppler.

61. A method for assisting in a position determination function in a mobile satellite positioning system (SPS) receiver which is coupled to a mobile cell based communication system, said method comprising:

determining an approximate location of said mobile SPS receiver, said approximate location being determined by at least one of a location of a cellular service area which includes a cell site which communicates with said mobile cell based communication system or a location of said cell site;

transmitting said approximate location to said mobile cell based communication system for use in said mobile SPS receiver, wherein said mobile SPS receiver determines at least one pseudorange to at least one SPS satellite which transmits ephemeris data for said at least one SPS satellite and wherein said mobile SPS receiver and said mobile cell based communication system do not use a common communication link.

62. A method as in claim 61 wherein said mobile SPS receiver determines its position and transmits said position through said mobile cell based communication system.

63. A method for assisting in a position determination function in a mobile satellite positioning system (SPS) receiver which is coupled to a mobile cell based communication system, said method comprising:

identifying a site information which determines an approximate location of said mobile SPS receiver, said approximate location being determined by at least one of a location of a cellular service area which includes a cell site which communicates with said mobile cell based communication system or a location of said cell site;

determining an SPS assistance data based upon said approximate location for at least one SPS satellite which transmits ephemeris data for said at least one SPS satellite;

transmitting said SPS assistance data to said mobile cell based communication system and wherein said mobile SPS receiver receives SPS signals which include pseudorandom signal data from SPS satellites and wherein said mobile SPS receiver and said mobile cell based communication system do not use a common communication link.

64. A method as in claim 63 wherein said SPS assistance data comprises at least one of: (a) an approximate Doppler relative to an SPS satellite; (b) differential SPS correction data relative to said SPS satellite; (c) ephemeris data for said SPS satellite; or (d) a specification of SPS satellites in view of said mobile SPS receiver.

65. A method for determining a position information of a mobile satellite positioning system (SPS) receiver which is coupled to a mobile cell based communication system, said method comprising:

determining an approximate location of said mobile SPS receiver, said approximate location being determined by at least one of a location of a cellular service area which includes a cell site which communicates with said mobile cell based communication system or a location of said cell site;

determining a differential SPS correction data based on said approximate location and wherein said mobile SPS receiver and said mobile cell based communication system do not use a common communication link.

66. A method as in claim 65 further comprising:

transmitting said differential SPS correction data to said mobile cell based communication system.

67. A method as in claim 66 wherein said mobile SPS receiver receives SPS signals from SPS satellites and determines pseudorange data from said SPS signals, said mobile SPS receiver using said pseudorange data and said differential SPS correction data to determine a position of said mobile SPS receiver.

68. A method for determining a position information of a mobile satellite positioning system (SPS) receiver which is coupled to a mobile cell based communication system, said method comprising:

receiving at said mobile cell based communication system an approximate location of said mobile SPS receiver, said approximate location being determined by at least one of a location of a cellular service area which includes a cell site which communicates with said mobile cell based communication system or a location of said cell site;

determining an approximate Doppler for at least one SPS satellite relative to said mobile SPS receiver, said approximate Doppler being based on said approximate location;

determining at least one pseudorange to at least one SPS satellite which transmits ephemeris data and wherein said mobile SPS receiver and said mobile cell based communication system do not use a common communication link.

69. A method as in claim 68 wherein said mobile SPS receiver determines said at least one pseudorange to said at least one SPS satellite which transmits ephemeris data for said at least one SPS satellite.

70. A method as in claim 69 wherein said mobile SPS receiver determines its position and transmits said position through said mobile cell based communication system.

71. A method as in claim 68 wherein said mobile cell based communication system receives first ephemeris data about said at least one SPS satellite and wherein said approximate Doppler is based on said approximate location and said first ephemeris data.

* * * * *